United States Patent
You et al.

(10) Patent No.: US 11,855,209 B2
(45) Date of Patent: Dec. 26, 2023

(54) SEMICONDUCTOR DEVICE

(71) Applicant: SAMSUNG ELECTRONICS CO., LTD., Suwon-si (KR)

(72) Inventors: Junggun You, Ansan-si (KR); Yoonjoong Kim, Seoul (KR); Seungwoo Do, Yongin-si (KR); Sungil Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 324 days.

(21) Appl. No.: 17/380,256

(22) Filed: Jul. 20, 2021

(65) Prior Publication Data

US 2022/0181489 A1    Jun. 9, 2022

(30) Foreign Application Priority Data

Dec. 7, 2020   (KR) .................. 10-2020-0169507

(51) Int. Cl.
   *H01L 29/78*      (2006.01)
   *H01L 29/10*      (2006.01)
(52) U.S. Cl.
   CPC ...... *H01L 29/7848* (2013.01); *H01L 29/1033* (2013.01)
(58) Field of Classification Search
   CPC ............ H01L 29/7848; H01L 29/1033; H01L 29/41766; H01L 29/42392; H01L 29/0673; H01L 29/1054; H01L 27/0886; H01L 29/165

See application file for complete search history.

(56) References Cited

U.S. PATENT DOCUMENTS

| | | | |
|---|---|---|---|
| 8,865,489 B2 | 10/2014 | Rogers et al. | |
| 9,076,537 B2 | 7/2015 | Khvalkovskiy et al. | |
| 9,105,830 B2 | 8/2015 | Khvalkovskiy et al. | |
| 9,768,305 B2 | 9/2017 | Ko et al. | |
| 10,243,040 B1 | 3/2019 | Park et al. | |
| 10,269,962 B2 | 4/2019 | Lee et al. | |
| 10,658,512 B2 | 5/2020 | Zhou | |
| 10,672,667 B2 * | 6/2020 | Cheng | H01L 21/823807 |
| 10,727,298 B2 | 7/2020 | Peng et al. | |
| 10,749,040 B2 | 8/2020 | Kong et al. | |
| 10,756,089 B2 | 8/2020 | Chiang et al. | |
| 10,756,179 B2 | 8/2020 | Yang et al. | |
| 2020/0020692 A1 | 1/2020 | Ching et al. | |
| 2020/0020783 A1 | 1/2020 | Zhou | |
| 2020/0058800 A1 | 2/2020 | Wang | |

* cited by examiner

*Primary Examiner* — Changhyun Yi
(74) *Attorney, Agent, or Firm* — Muir Patent Law, PLLC

(57) ABSTRACT

A semiconductor device including a substrate that includes first to third regions; a first channel structure on the first region and including first channel patterns that are vertically stacked on the substrate; a second channel structure on the second region and including a second channel pattern on the substrate; a third channel structure on the third region and including third channel patterns and fourth channel patterns that are vertically and alternately stacked on the substrate; first to third gate electrodes on the first to third channel structures; and first to third source/drain patterns on opposite sides of the first to third channel structures, wherein the first, second, and fourth channel patterns include a first semiconductor material, and the third channel patterns include a second semiconductor material different from the first semiconductor material.

20 Claims, 24 Drawing Sheets

SEMICONDUCTOR DEVICE

CROSS-REFERENCE TO RELATED APPLICATION

Korean Patent Application No. 10-2020-0169507 filed on Dec. 7, 2020 in the Korean Intellectual Property Office, and entitled: "Semiconductor Device," is incorporated by reference herein in its entirety.

BACKGROUND

1. Field

Embodiments relate to a semiconductor device.

2. Description of the Related Art

A semiconductor device may include an integrated circuit including metal oxide semiconductor field effect transistors (MOSFETs).

SUMMARY

The embodiments may be realized by providing a semiconductor device including a substrate that includes a first region, a second region, and a third region; a first channel structure on the first region, the first channel structure including a plurality of first channel patterns that are vertically stacked on the substrate; a second channel structure on the second region, the second channel structure including a second channel pattern on the substrate; a third channel structure on the third region, the third channel structure including a plurality of third channel patterns and a plurality of fourth channel patterns that are vertically and alternately stacked on the substrate; a first gate electrode on the first channel structure, a second gate electrode on the second channel structure, and a third gate electrode on the third channel structure; and a first source/drain pattern on opposite sides of the first channel structure, a second source/drain pattern on opposite sides of the second channel structure, and a third source/drain pattern on opposite sides of the third channel structure, wherein the plurality of first channel patterns, the second channel pattern, and the plurality of fourth channel patterns each include a first semiconductor material, and the plurality of third channel patterns include a second semiconductor material different from the first semiconductor material.

The embodiments may be realized by providing a semiconductor device including a substrate that includes a first region, a second region, and a third region; a first channel structure on the first region, the first channel structure including a plurality of first channel patterns that are vertically stacked on the substrate; a second channel structure on the second region, the second channel structure including a second channel pattern on the substrate; a third channel structure on the third region, the third channel structure including a plurality of third channel patterns and a plurality of fourth channel patterns that are vertically and alternately stacked on the substrate; a first gate electrode on the first channel structure, a second gate electrode on the second channel structure, and a third gate electrode on the third channel structure; a first dielectric layer between the first gate electrode and the first channel structure, a second dielectric layer between the second gate electrode and the second channel structure, and a third gate dielectric layer between the third gate electrode and the third channel structure; and a first source/drain pattern on opposite sides of the first channel structure, a second source/drain pattern on opposite sides of the second channel structure, and a third source/drain pattern on opposite sides of the third channel structure, wherein the third channel structure has an uneven sidewall, and the third gate dielectric layer covers the uneven sidewall.

The embodiments may be realized by providing a semiconductor device including a substrate that includes a first region, a second region, and a third region; a first channel structure on the first region, the first channel structure including a plurality of first channel patterns that are vertically stacked on the substrate; a second channel structure on the second region, the second channel structure including a second channel pattern on the substrate; a third channel structure on the third region, the third channel structure having an uneven sidewall and including a plurality of third channel patterns and a plurality of fourth channel patterns that are vertically and alternately stacked on the substrate; a first gate electrode on the first channel structure, a second gate electrode on the second channel structure, and a third gate electrode on the third channel structure; a first dielectric layer between the first gate electrode and the first channel structure, a second dielectric layer between the second gate electrode and the second channel structure, and a third gate dielectric layer between the third gate electrode and the third channel structure; and a first source/drain pattern on opposite sides of the first channel structure, a second source/drain pattern on opposite sides of the second channel structure, and a third source/drain pattern on opposite sides of the third channel structure, wherein the plurality of first channel patterns, the second channel pattern, and the plurality of fourth channel patterns each include silicon, and the plurality of third channel patterns each include silicon-germanium.

BRIEF DESCRIPTION OF THE DRAWINGS

Features will be apparent to those of skill in the art by describing in detail exemplary embodiments with reference to the attached drawings in which:

FIGS. 6A to 14A illustrate cross-sectional views taken along lines A-A', B-B', and C-C' of FIG. 1, of stages in a method of fabricating a semiconductor device according to some example embodiments.

FIGS. 6B to 14B illustrate cross-sectional views taken along lines D-D', E-E', and F-F' of FIG. 1, of stages in a method of fabricating a semiconductor device according to some example embodiments.

DETAILED DESCRIPTION

Figure 1:
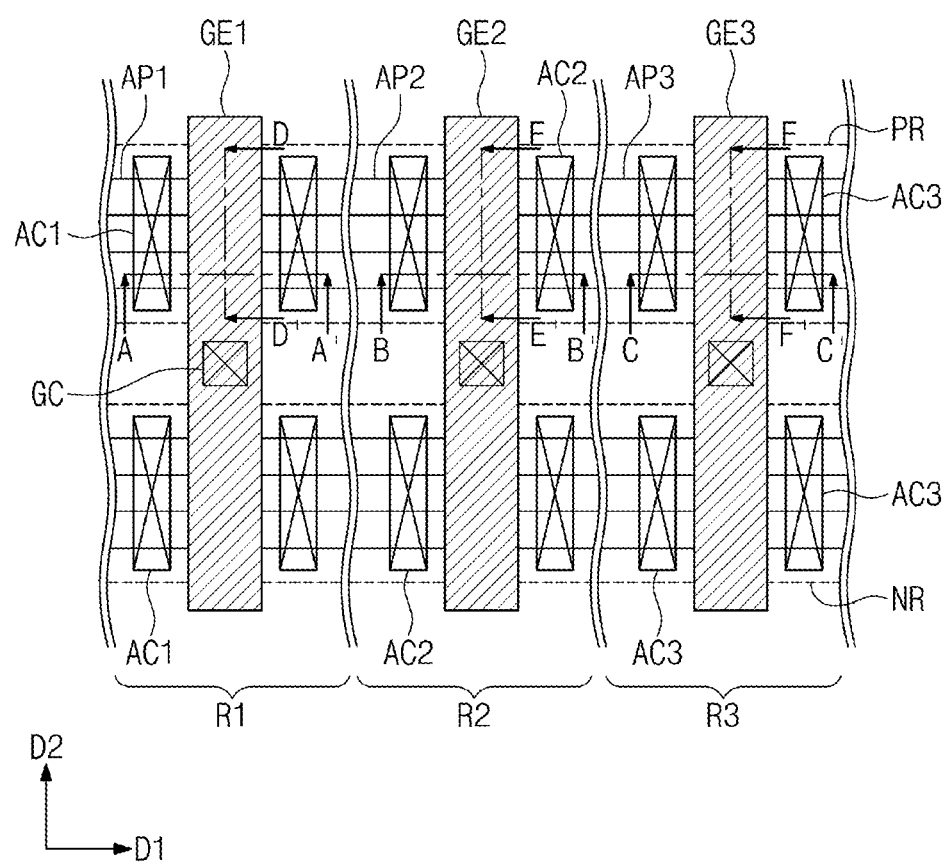
FIG. 1 illustrates a plan view of a semiconductor device according to some example embodiments.
Figure 2A:
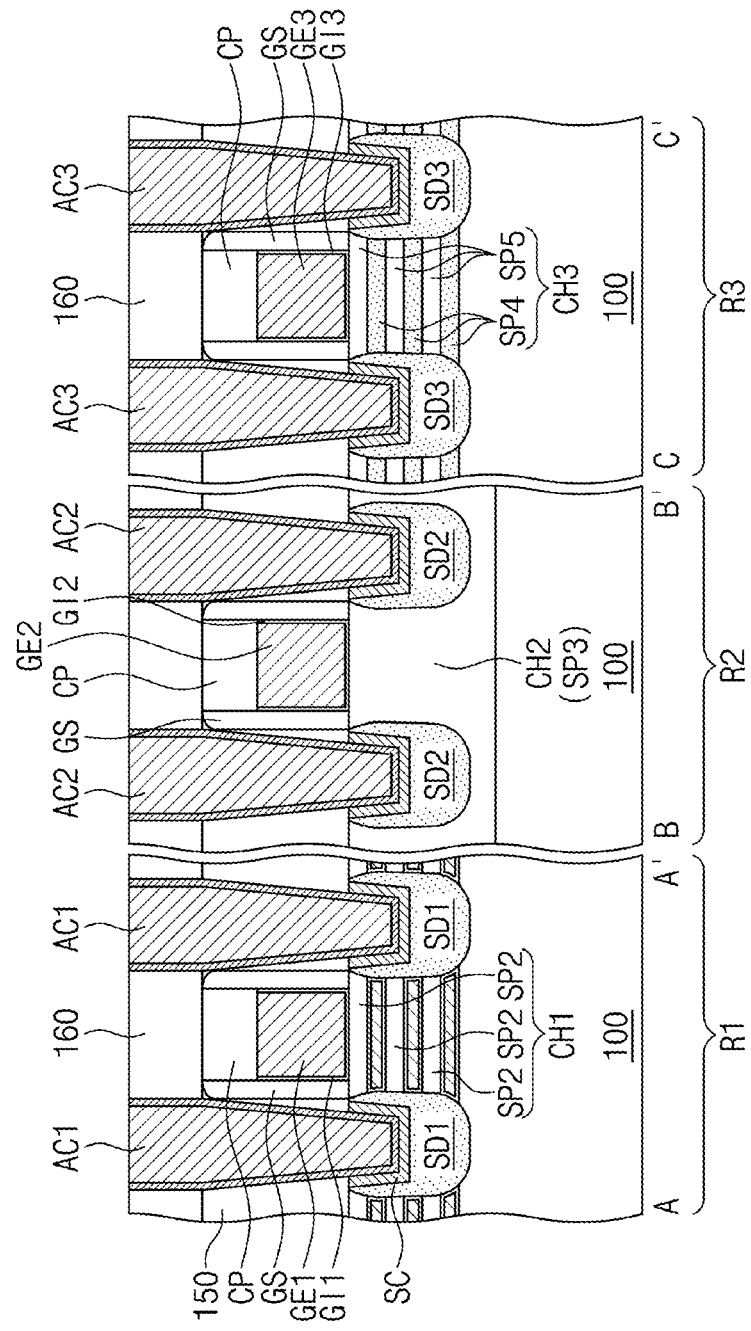
FIG. 2A illustrates a cross-sectional view taken along lines A-A', B-B', and C-C' of FIG. 1, of a semiconductor device according to some example embodiments.
Figure 2B:
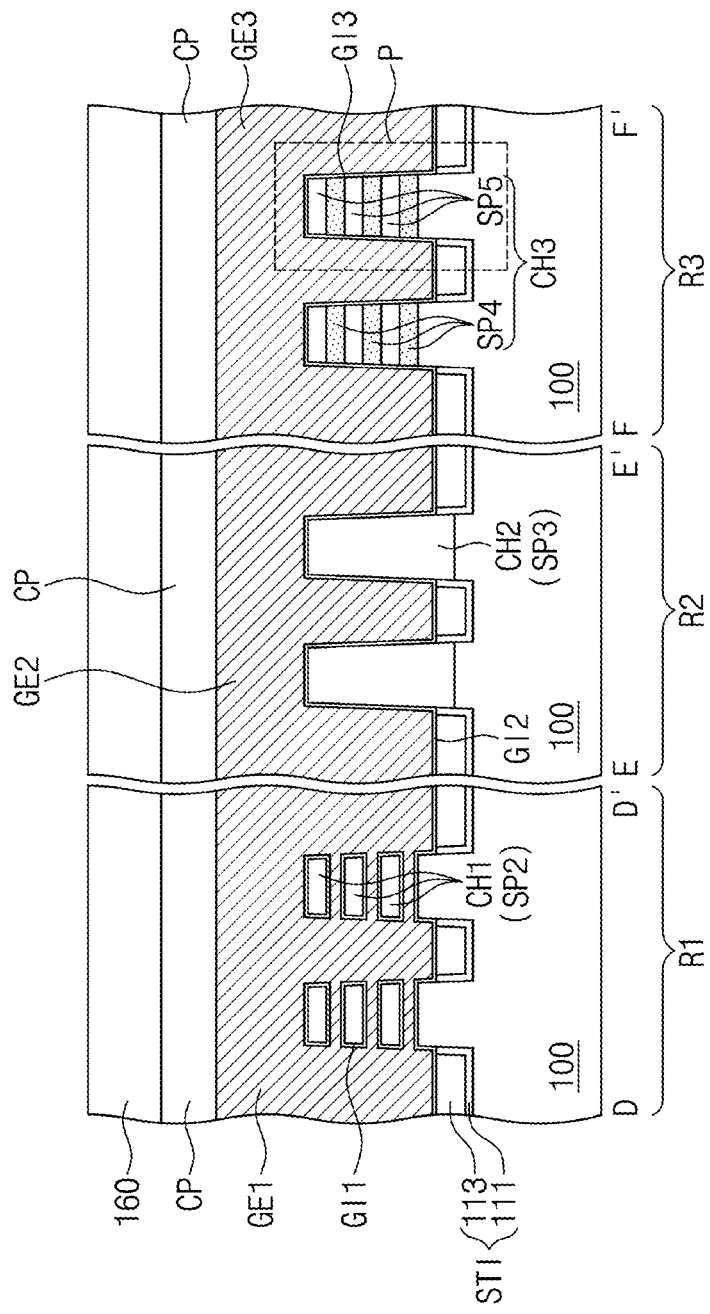
FIG. 2B illustrates a cross-sectional view taken along lines D-D', E-E', an F-F' of FIG. 1, of a semiconductor device according to some example embodiments.
Figure 3:
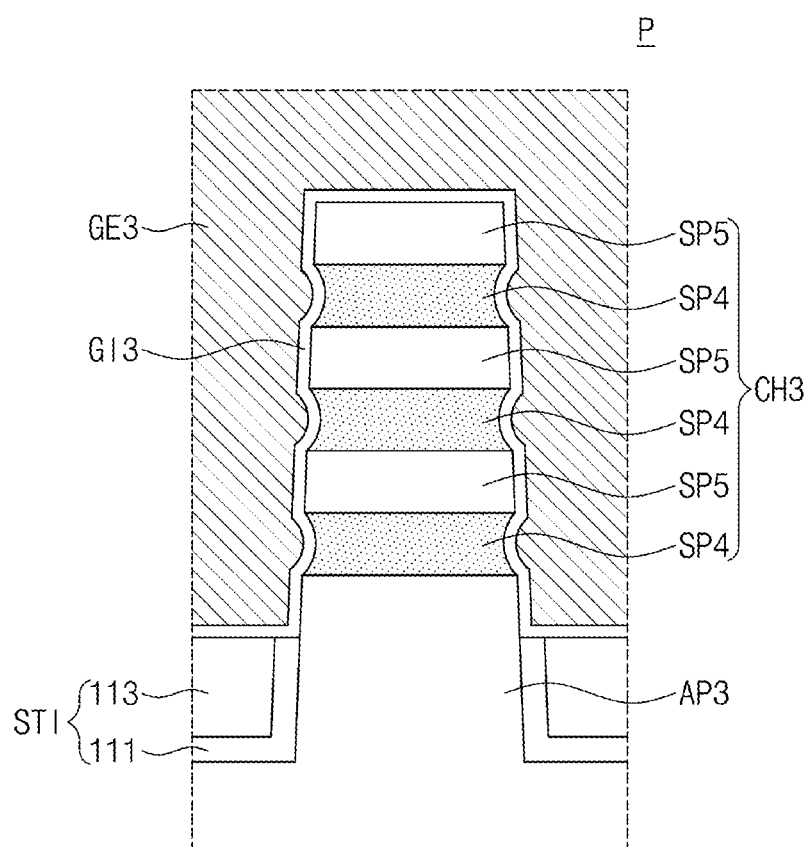
FIG. 3 illustrates an enlarged view of section C of FIG. 2B.

FIG. 1 illustrates a plan view of a semiconductor device according to some example embodiments. FIG. 2A illustrates a cross-sectional view taken along lines A-A', B-B', and C-C' of FIG. 1, of a semiconductor device according to some example embodiments. FIG. 2B illustrates a cross-sectional view taken along lines D-D', E-E', an F-F' of FIG. 1, of a semiconductor device according to some example embodiments. FIG. 3 illustrates an enlarged view of section C of FIG. 2B.

Referring to FIGS. 1, 2A, and 2B, a substrate 100 may include a first region R1, a second region R2, and a third region R3.

The substrate 100 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). In an implementation, the substrate 100 may be a III-V group compound semiconductor substrate. The III-V group compound semiconductor substrate may include, e.g., gallium arsenide (GaAs), indium gallium arsenide (InGaAs), aluminum gallium arsenide (AlGaAs), or a mixture thereof. In an implementation, the substrate 100 may be a bulk silicon substrate doped with n-type or p-type impurities. As used herein, the term "or" is not an exclusive term, e.g., "A or B" would include A, B, or A and B.

In an implementation, the first region R1 may be an area including a standard cell that constitutes a logic circuit thereon. The second and third regions R2 and R3 may each be an area including transistors that constitute a process core or an input/output terminal thereon.

Each of the first, second, and third regions R1, R2, and R3 may include first and second active regions PR and NR. In an implementation, PMOS field effect transistors may be on the first active region PR, and NMOS field effect transistors may be on the second active region NR. The substrate 100 may include dopants having different conductivity types from each other on the first and second active regions PR and NR. In an implementation, the substrate 100 of the first active region PR may be doped with first dopants having a first conductivity type, and the substrate 100 of the second active region NR may be doped with second dopants having a second conductivity type.

A plurality of first active patterns AP1 may be on the first and second active regions PR and NR of the first region R1. A plurality of second active patterns AP2 may be on the first and second active regions PR and NR of the second region R2. A plurality of third active patterns AP3 may be on the first and second active regions PR and NR of the third region R3.

The first, second, and third active patterns AP1, AP2, and AP3 may extend (e.g., lengthwise) in a first direction D1 and may be spaced apart from each other in a second direction D2 that intersects the first direction D1. The first, second, and third active patterns AP1, AP2, and AP3 may be vertically protruding portions of the substrate 100.

Device isolation patterns STI may be between the first active patterns AP1, between the second active patterns AP2, and between the third active patterns AP3. The device isolation patterns STI may have top surfaces lower than those of the first, second, and third active patterns AP1, AP2, and AP3, and the first, second, and third active patterns AP1, AP2, and AP3 may have upper portions that upwardly protrude from or above the top surfaces of the device isolation patterns STI.

The device isolation patterns STI may each include a buried dielectric pattern and a liner dielectric pattern between the buried dielectric pattern and the substrate 100. The liner dielectric pattern and the buried dielectric pattern may include different dielectric materials from each other. The liner dielectric pattern and the buried dielectric pattern may consist of or include, e.g., a silicon oxide layer, a silicon oxynitride layer, or a silicon nitride layer.

A first channel structure CH1 may be on each of the first active patterns AP1. Each of the first channel structures CH1 may include first channel patterns SP2 that are vertically stacked. The first channel patterns SP2 may include, e.g., silicon (Si), germanium (Ge), silicon-germanium (SiGe), or a III-V group compound semiconductor.

A second channel structure CH2 may be on each of the second active patterns AP2. The second channel structure CH2 may have a top surface at substantially the same level (e.g., a same vertical distance from the substrate 100) as that of a top surface of the first channel structure CH1. Each of the second channel structures CH2 may include a second channel pattern SP3. The second channel pattern SP3 may include the same semiconductor material as that of the first channel patterns SP2. The second channel pattern SP3 may include, e.g., silicon (Si), germanium (Ge), silicon-germanium (SiGe), or a III-V group compound semiconductor. In an implementation, the second channel pattern SP3 may include single-crystalline silicon.

A third channel structure CH3 may be on each of the third active patterns AP3. The third channel structure CH3 may have a top surface at substantially the same level as those of the top surfaces of the first channel structures CH1. Each of the third channel structures CH3 may include third and fourth channel patterns SP4 and SP5 that are vertically and alternately stacked. The fourth channel patterns SP5 may be at substantially the same level as that of the first channel patterns SP2, and may include the same semiconductor material as that of the first channel patterns SP2.

The third and fourth channel patterns SP4 and SP5 may include different semiconductor materials from each other, and the semiconductor materials may include, e.g., silicon (Si), germanium (Ge), silicon-germanium (SiGe), or a III-V group compound semiconductor. In an implementation, the third channel patterns SP4 may include silicon-germanium (SiGe), and the fourth channel patterns SP5 may include silicon (Si).

In an implementation, as shown in FIG. 3, the third channel structure CH3 may have an uneven (e.g., not flat or non-planar) sidewall or a bumpy sidewall. In an implementation, the third channel patterns SP4 may have sidewalls more laterally recessed (e.g., inwardly laterally recessed) than those of the fourth channel patterns SP5. In an implementation, sidewalls of the third channel patterns SP4 may be laterally recessed to a depth greater than a depth to which the fourth channel patterns SP5 are recessed (e.g., which may not be recessed at all). In an implementation, each of the third channel patterns SP4 may have a rounded (e.g., inwardly concavely rounded) sidewall.

On the first region R1, a first gate electrode GE1 may extend across the first active patterns AP1 and the first channel structures CH1. The first gate electrode GE1 may extend from the first active region PR toward the second active region NR. The first gate electrode GE1 may vertically overlap the first channel patterns SP2. The first gate electrode GE1 may extend in the second direction D2 and may surround each of the first channel patterns SP2. In an implementation, the first gate electrode GE1 may have portions between the first channel patterns SP2 that are vertically adjacent to each other. Thus, transistors on the first region R1 may be three-dimensional field effect transistors (e.g., MBCFET or GAAFET) in which a gate electrode three-dimensionally surrounds a nano-wire channel or a nano-sheet channel.

The first gate electrode GE1 may include a barrier metal pattern and a metal pattern. The barrier metal pattern may include conductive metal nitride (e.g., titanium nitride, tantalum nitride, or tungsten nitride). The metal pattern may include a metallic material (e.g., tungsten, aluminum, titanium, or tantalum).

A first gate dielectric layer GI1 may be between the first gate electrode GE1 and the first channel patterns SP2. The first gate dielectric layer GI1 may conformally cover top and bottom surfaces and opposite sidewalls of each of the first channel patterns SP2. The first gate dielectric layer GI1 may cover the top surface of the device isolation pattern STI below the first gate electrode GE1.

The first gate dielectric layer GI1 may include a silicon oxide layer, a silicon oxynitride layer, or a high-k dielectric layer. The high-k dielectric layer may include a high-k dielectric material whose dielectric constant is greater than that of a silicon oxide layer. In an implementation, the high-k dielectric material may include hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

On the second region R2, a second gate electrode GE2 may extend across the second active patterns AP2 and the second channel structures CH2. The second gate electrode GE2 may extend from the first active region PR toward the second active region NR. The second gate electrode GE2 may extend in the second direction D2 and may cover opposite sidewalls and a top surface of the second channel pattern SP3. In such cases, transistors on the second region R2 may be fin-shaped transistor (FinFET) in which a gate electrode surrounds a fin-shaped channel that protrudes from the substrate 100. In an implementation, the second gate electrode GE2 may have substantially the same line-width and material as those of the first gate electrode GE1.

A second gate dielectric layer GI2 may be between the second gate electrode GE2 and the second channel pattern SP3. The second gate dielectric layer GI2 may conformally cover opposite sidewalls and a top surface of the second channel pattern SP3. The second gate dielectric layer GI2 may cover the top surface of the device isolation pattern STI below the second gate electrode GE2. The second gate dielectric layer GI2 may include the same material as that of the first gate dielectric layer GI1.

On the third region R3, a third gate electrode GE3 may extend across the third active patterns AP3 and the third channel structures CH3. The third gate electrode GE3 may extend from the first active region PR toward the second active region NR. The third gate electrode GE3 may extend in the second direction D2, and may cover opposite sidewalls of each of the third and fourth channel patterns SP4 and SP5 and a top surface of an uppermost fourth channel pattern SP5. In an implementation, the third gate electrode GE3 may have substantially the same line-width and material as those of the first gate electrode GE1.

A third gate dielectric layer GI3 may be between the third gate electrode GE3 and the third channel structure CH3. The third gate dielectric layer GI3 may cover opposite sidewalls of each of the third and fourth channel patterns SP4 and SP5, and may conformally cover the top surface of the uppermost fourth channel pattern SP5. The third gate dielectric layer GI3 may cover the top surface of the device isolation pattern STI below the third gate electrode GE3. The third gate dielectric layer GI3 may include the same material as that of the first gate dielectric layer GI1.

In an implementation, referring to FIG. 3, the third gate dielectric layer GI3 may conformally cover the uneven sidewall of the third channel structure CH3. In such cases, the third gate dielectric layer GI3 may cover the rounded sidewalls of the third channel patterns SP4. In an implementation, the third channel structure CH3 may have the uneven sidewall, and a thickness of the third gate dielectric layer GI3 on the sidewalls of the third channel patterns SP4 may be different from a thickness of the third gate dielectric layer GI3 on the sidewalls of the fourth channel patterns SP5.

Capping dielectric patterns CP may be on the first, second, and third gate electrodes GE1, GE2, and GE3. The capping dielectric patterns CP may extend in the second direction D2 along the first, second, and third gate electrodes GE1, GE2, and GE3. The capping dielectric patterns CP may include, e.g., silicon oxide, silicon nitride, silicon oxynitride, silicon carbon nitride (SiCN), or silicon carbon oxynitride (SiCON).

Gate spacers GS may be on opposite sidewalls of each of the first, second, and third gate electrodes GE1, GE2, and GE3. The gate spacers GS may extend in the second direction D2 along the first, second, and third gate electrodes GE1, GE2, and GE3. The gate spacers GS may include SiCN, SiCON, or SiN. In an implementation, the gate spacers GS may each include a multi-layer formed of at least two of SiCN, SiCON, and SiN.

First source/drain patterns SD1 may be on the first active patterns AP1 on opposite sides of the first channel structure CH1. The first channel patterns SP2 may be between a pair of first source/drain patterns SD1. In an implementation, the pair of first source/drain patterns SD1 may be connected to each other through the first channel patterns SP2 that are vertically stacked.

Each of the first source/drain patterns SD1 may have a top surface at substantially the same level as that of a top surface of an uppermost first channel patterns SP2. In an implementation, at least one of the first source/drain patterns SD1 may have a top surface higher than that of the uppermost first channel pattern SP2 adjacent thereto.

The first source/drain pattern SD1 on the first active region PR may include impurities whose conductivity type is different from that of impurities included in the first source/drain pattern SD1 on the second active region NR. The first source/drain pattern SD1 on the first active region PR may be formed of a semiconductor material whose lattice constant is different from that of a semiconductor material included in the first source/drain pattern SD1 on the second active region NR. The first source/drain patterns SD1 may include silicon carbide or silicon germanium.

Second source/drain patterns SD2 may be on the second active patterns AP2 on opposite sides of the second channel structure CH2. The second channel pattern SP3 may be between the pair of second source/drain patterns SD2.

Each of the second source/drain patterns SD2 may have a top surface at substantially the same level as that of the top surface of the second channel pattern SP3. In an implementation, at least one of the second source/drain patterns SD2 may have a top surface higher than that of the second channel pattern SP3 adjacent thereto.

The second source/drain pattern SD2 on the first active region PR may include impurities whose conductivity type is different from that of impurities included in the second source/drain pattern SD2 on the second active region NR. The second source/drain pattern SD2 on the first active region PR may be formed of a semiconductor material whose lattice constant is different from that of a semiconductor material included in the second source/drain pattern SD2 on the second active region NR. The second source/drain patterns SD2 may include silicon carbide or silicon germanium.

Third source/drain patterns SD3 may be on the third active patterns AP3 on opposite sides of the third channel structure CH3. The third and fourth channel patterns SP4 and SP5 may be between a pair of third source/drain patterns SD3. In an implementation, the pair of third source/drain patterns SD3 may be connected to each other through the third and fourth channel patterns SP4 and SP5 that are alternately stacked.

Each of the third source/drain patterns SD3 may have a top surface at substantially the same level as that of a top surface of an uppermost fourth channel pattern SP5. In an implementation, at least one of the third source/drain patterns SD3 may have a top surface higher than that of the uppermost fourth channel pattern SP5.

The third source/drain pattern SD3 on the first active region PR may include impurities whose conductivity type is different from that of impurities included in the third source/drain pattern SD3 on the second active region NR. The third source/drain pattern SD3 on the first active region PR may be formed of a semiconductor material whose lattice constant is different from that of a semiconductor material included in the third source/drain pattern SD3 on the second active region NR. The third source/drain patterns SD3 may include silicon carbide or silicon germanium.

A first interlayer dielectric layer 150 may cover the first, second, and third source/drain patterns SD1, SD2, and SD3. The first interlayer dielectric layer 150 may have a top surface substantially coplanar with those of the capping dielectric patterns CP and those of the gate spacers GS. The first interlayer dielectric layer 150 may include a second interlayer dielectric layer 160 thereon that covers the top surfaces of the capping dielectric patterns CP. In an implementation, the first and second interlayer dielectric layers 150 and 160 may include a silicon oxide layer.

First, second, and third active contacts AC1, AC2, and AC3 may penetrate the first and second interlayer dielectric layers 150 and 160 and may be correspondingly coupled to the first, second, and third source/drain patterns SD1, SD2, and SD3.

When viewed in a plan view, each of the first, second, and third active contacts AC1, AC2, and AC3 may have a bar shape that extends in the second direction D2.

Each of the first, second, and third active contacts AC1, AC2, and AC3 may include a barrier metal pattern and a metal pattern. In an implementation, the first, second, and third active contacts AC1, AC2, and AC3 may include a metal, e.g., tungsten, titanium, or cobalt, or a conductive metal nitride, e.g., titanium nitride, tantalum nitride, or tungsten nitride.

Each of the first, second, and third active contacts AC1, AC2, and AC3 may be a self-aligned contact. In an implementation, the capping dielectric patterns CP and the gate spacers GS may be used to form the first, second, and third active contacts AC1, AC2, and AC3 in a self-aligned manner. In an implementation, the first, second, and third active contacts AC1, AC2, and AC3 may cover at least a portion of a sidewall of the gate spacer GS. In an implementation, the first, second, and third active contacts AC1, AC2, and AC3 may partially cover the top surfaces of the capping dielectric patterns CP.

A silicide pattern SC may be between each of the first, second, and third active contacts AC1, AC2, and AC3 and each of the first, second, and third source/drain patterns SD1, SD2, and SD3.

The first, second, and third active contacts AC1, AC2, and AC3 may be electrically connected through the silicide patterns SC to the first, second, and third source/drain patterns SD1, SD2, and SD3, respectively. The silicide pattern SC may include a metal silicide, e.g., titanium silicide, tantalum silicide, tungsten silicide, nickel silicide, or cobalt silicide.

Gate contacts GC may penetrate the second interlayer dielectric layer 160 and the capping dielectric patterns CP, and may be correspondingly coupled to the first, second, and third gate electrodes GE1, GE2, and GE3. Like the first, second, and third active contacts AC1, AC2, and AC3, the gate contacts GC may each include a barrier metal pattern and a metal pattern.

Figure 4:
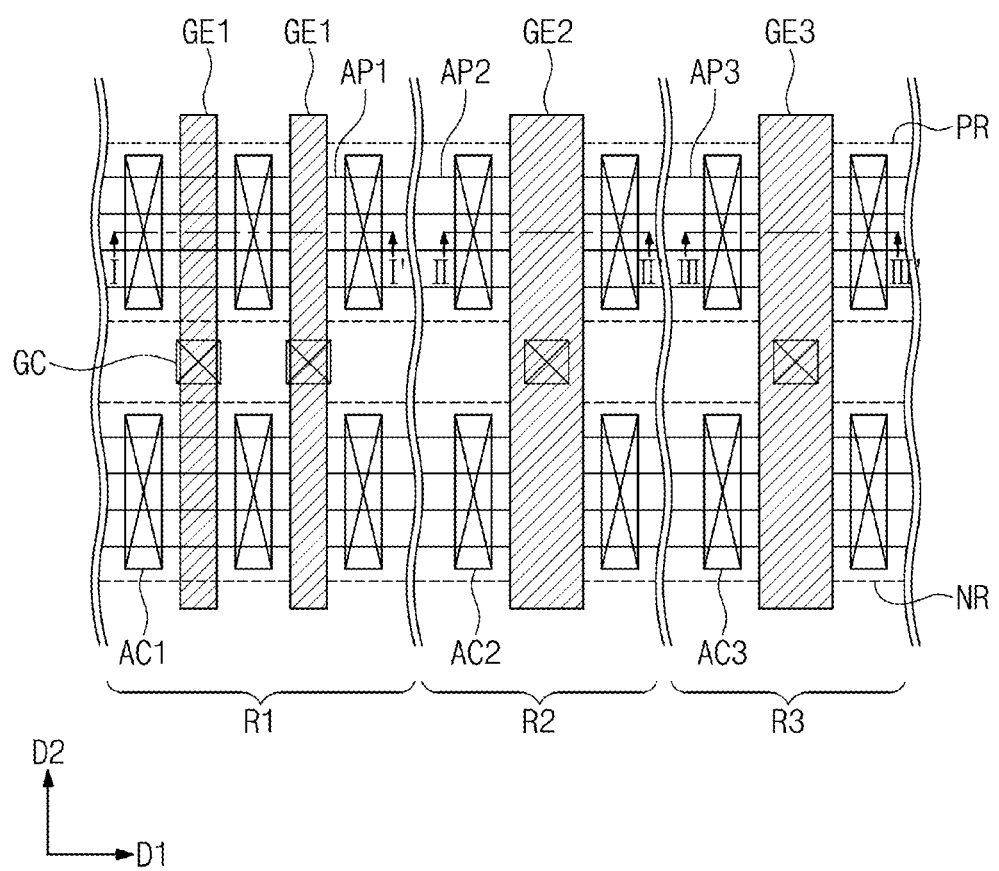
FIG. 4 illustrates a plan view of a semiconductor device according to some example embodiments.
Figure 5:
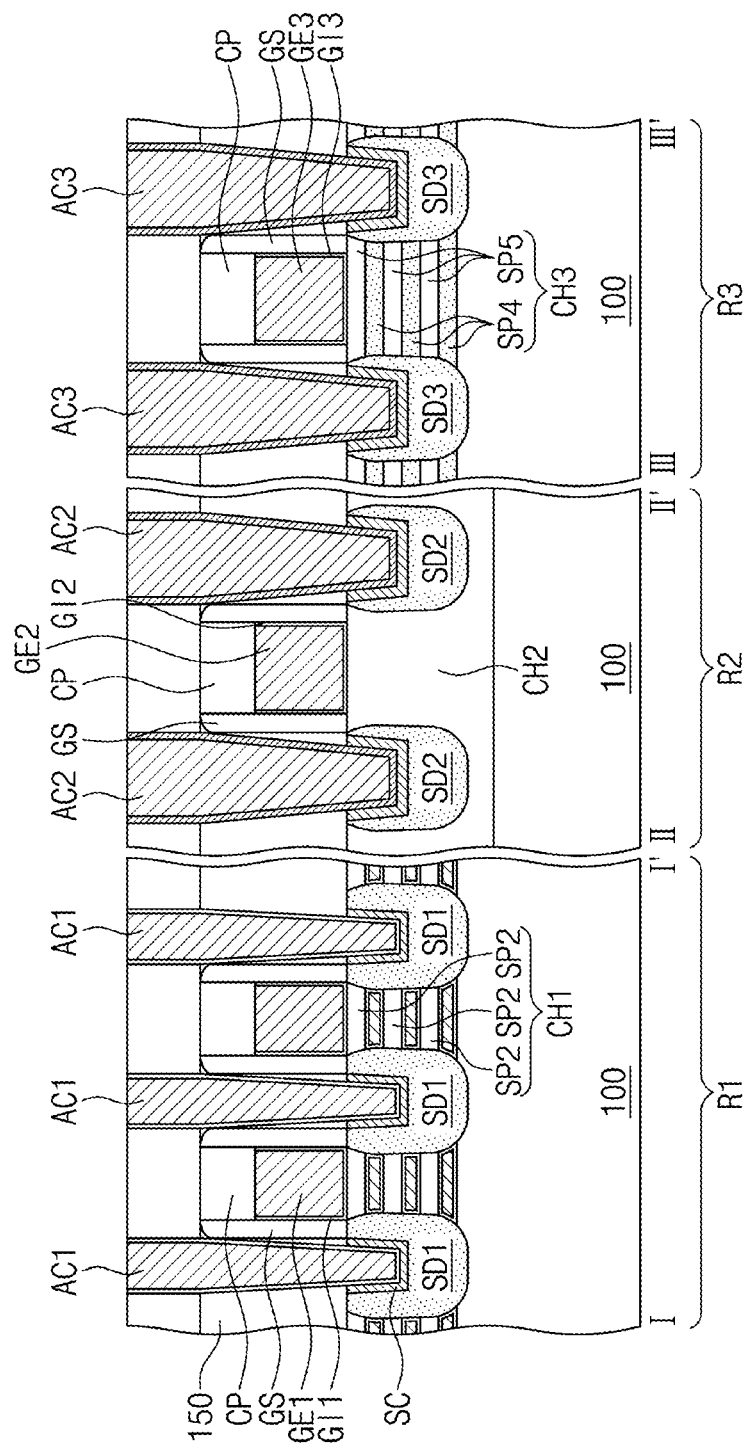
FIG. 5 illustrates a cross-sectional view taken along lines I-I', and of FIG. 4, of a semiconductor device according to some example embodiments.

FIG. 4 illustrates a plan view of a semiconductor device according to some example embodiments. FIG. 5 illustrates a cross-sectional view taken along lines I-I', II-II', and of FIG. 4, of a semiconductor device according to some example embodiments. A description of technical features identical to those of the embodiments discussed above may be omitted to avoid redundancy, and a different thereof will be discussed in detail.

Referring to FIGS. 4 and 5, the substrate 100 may include the first, second, and third regions R1, R2, and R3. As discussed above, the first, second, and third gate electrodes GE1, GE2, and GE3 may be respectively on the first, second, and third regions R1, R2, and R3. The first, second, and third gate electrodes GE1, GE2, and GE3 may extend across the first, second, and third active patterns AP1, AP2, and AP3, respectively.

In an implementation, the first gate electrode GE1 may have a line-width different from those of the second and third gate electrodes GE2 and GE3. In an implementation, the first gate electrode GE1 may have a first line-width, the second gate electrode GE2 may have a second line-width, and the third gate electrode GE3 may have a third line-width. The first line-width may be less than (e.g., each of) the second and third line-widths. In an implementation, the second line-width may be substantially the same as the third line-width. In an implementation, the second line-width may be greater or less than the third line-width.

On the first region R1, the first channel patterns SP2 may each have a width in the first direction D1 less than a width in the first direction D1 of the second channel pattern SP3.

Each of the first gate electrodes GE1 may extend across a plurality of first active patterns AP1 on each of the first and second active regions PR and NR. In an implementation, each first gate electrode GE1 may extend across a single first active pattern AP1 on each of the first and second active regions PR and NR. Such features may also be applicable to the second and third gate electrodes GE2 and GE3.

In an implementation, as illustrated in the drawings, the first, second, and third active patterns AP1, AP2, and AP3 may have the same width. In an implementation, the first, second, and third active patterns AP1, AP2, and AP3 may have various widths.

FIGS. 6A to 14A illustrate cross-sectional views taken along lines A-A', B-B', and C-C' of FIG. 1, of stages in a method of fabricating a semiconductor device according to some example embodiments. FIGS. 6B to 14B illustrate cross-sectional views taken along lines D-D', E-E', and F-F' of FIG. 1, of stages in a method of fabricating a semiconductor device according to some example embodiments.

Figure 6A:
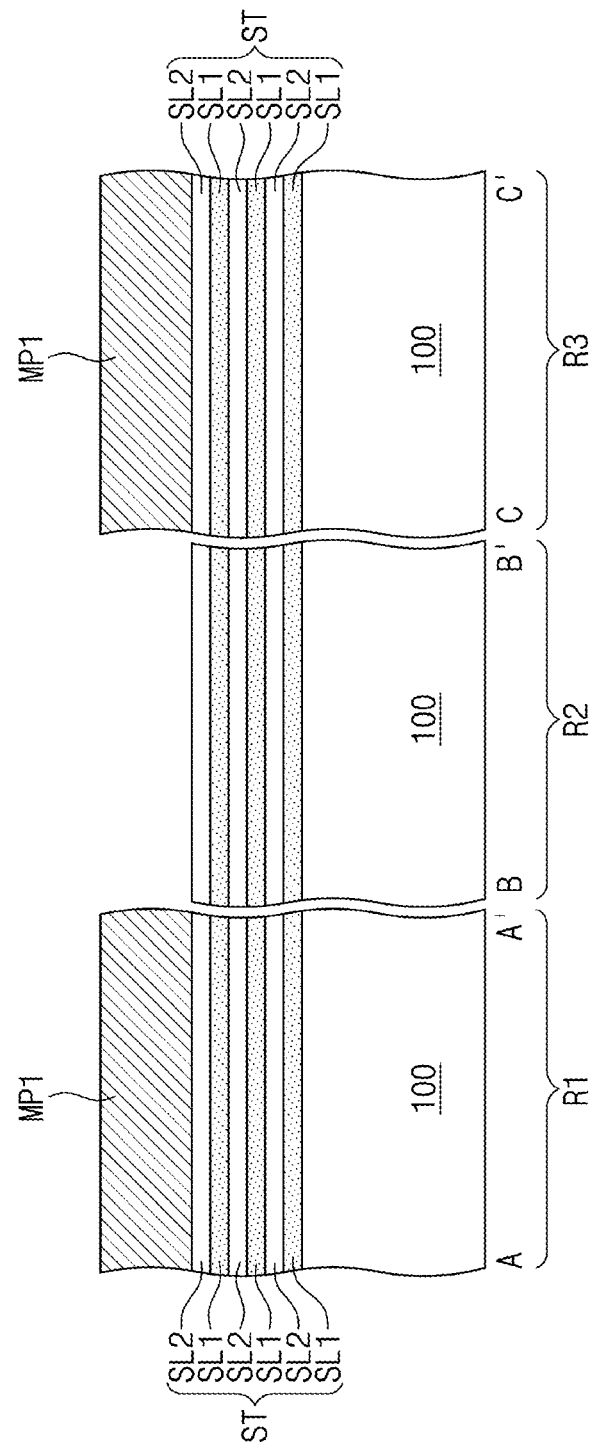
Figure 6B:
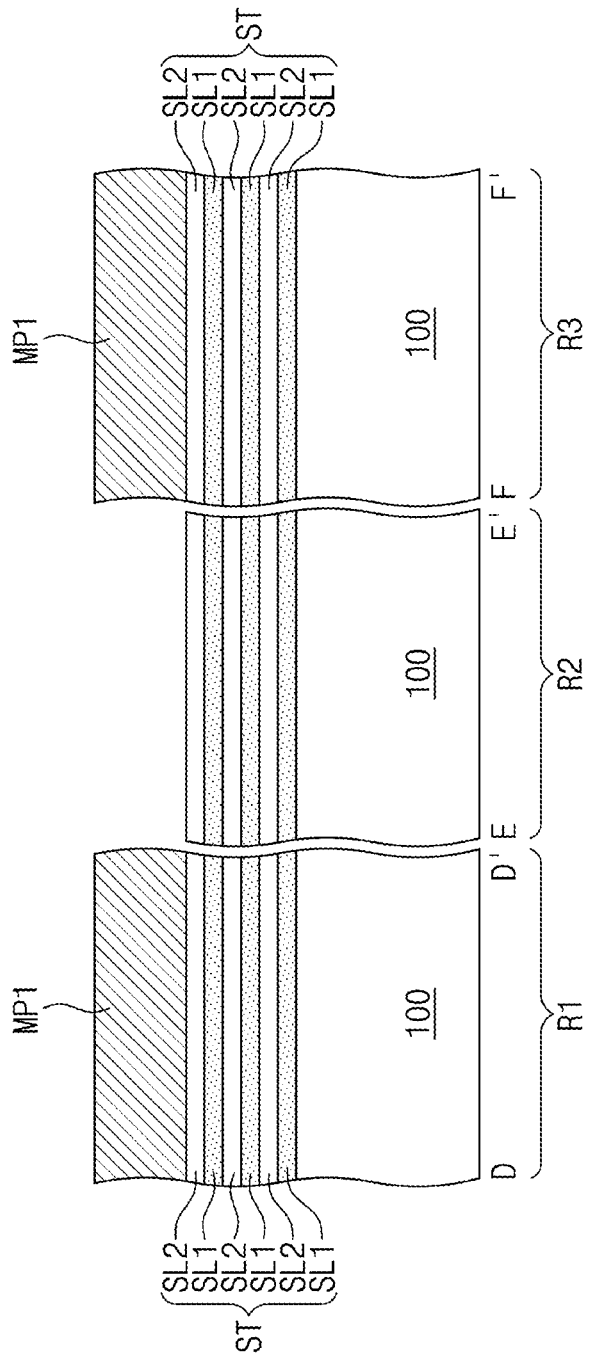

Referring to FIGS. 1, 6A, and 6B, a substrate 100 may include a first region R1, a second region R2, and a third region R3. The substrate 100 may be a compound semiconductor substrate or a semiconductor substrate including silicon, germanium, or silicon-germanium. In an implementation, the substrate 100 may be a bulk silicon substrate doped with n-type or p-type impurities.

Each of the first, second, and third regions R1, R2, and R3 may include first and second active regions PR and NR. The substrate 100 may include dopants having different conductivity types from each other on the first and second active regions PR and NR A stack structure ST may be formed by alternately stacking first semiconductor layers SL1 and second semiconductor layers SL2 on the substrate 100. The first and second semiconductor layers SL1 and SL2 may be formed by, e.g., an epitaxial growth method. The first semiconductor layers SL1 may be formed of a first semiconductor material, and the second semiconductor layers SL2 may be formed of a second semiconductor material different from the first semiconductor material. The first and second semiconductor materials may independently include, e.g., silicon (Si), germanium (Ge), silicon-germanium (SiGe), or a III-V group compound semiconductor.

In an implementation, the first semiconductor layers SL1 may include one of silicon (Si), germanium (Ge), silicon-germanium (SiGe), or a III-V group compound semiconductor, and the second semiconductor layers SL2 may include another of silicon (Si), germanium (Ge), silicon-germanium (SiGe), or a III-V group compound semiconductor. In an implementation, the first semiconductor layers SL1 may include silicon-germanium (SiGe), and the second semiconductor layers SL2 may include silicon (Si).

Afterwards, a first mask pattern MP1 may be formed on the stack structure ST, exposing the second region R2 and covering the first and third regions R1 and R3. The first mask pattern MP1 may be formed of, e.g., a silicon oxide layer, a silicon nitride layer, or a silicon oxynitride layer. The formation of the first mask pattern MP1 may include depositing a mask layer on the stack structure ST and patterning the mask layer to expose the stack structure ST on the second region R2.

Figure 7A:
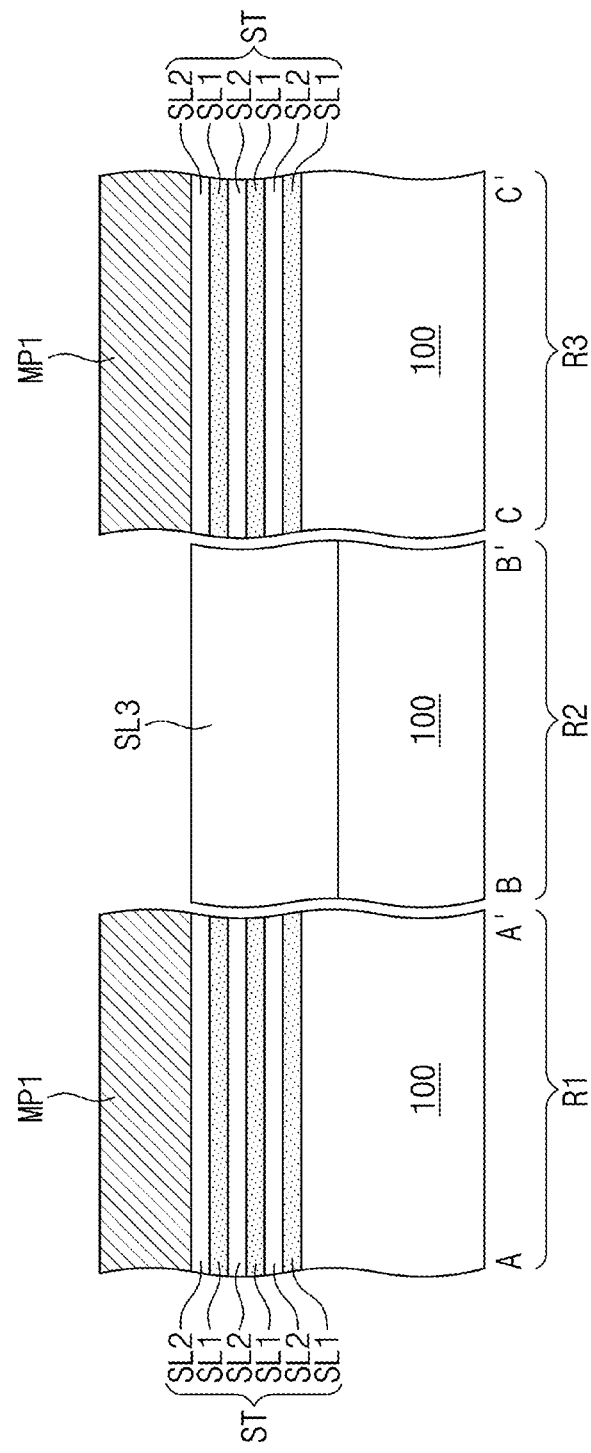
Figure 7B:
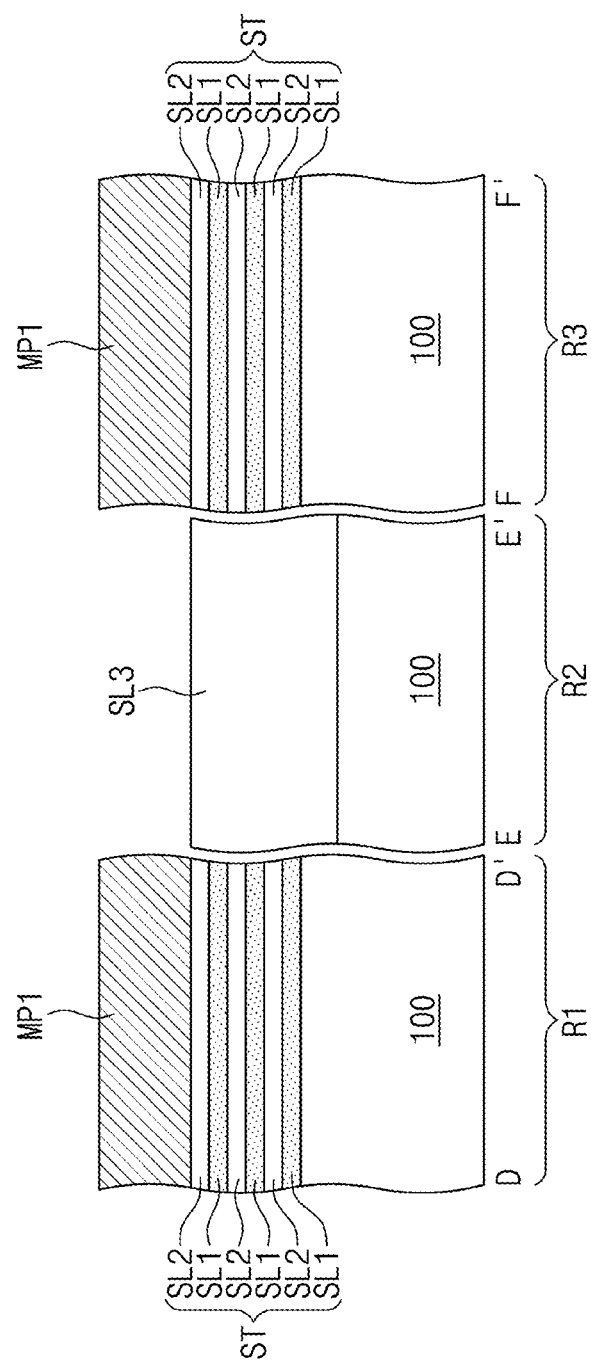

Referring to FIGS. 1, 7A, and 7B, third semiconductor layers SL3 may be formed on the substrate 100 of the second region R2. The third semiconductor layers SL3 may have a top surface at a level the same as or higher than that of a top surface of the stack structure ST of the first and third regions R1 and R3.

The formation of the third semiconductor layers SL3 may include using the first mask pattern MP1 as an etching mask to etch the stack structure ST to expose a top surface of the substrate 100 on the second region R2, and performing an epitaxial growth process in which the substrate 100 is used as a seed. The epitaxial growth process may include a vapor phase epitaxy (VPE) process, a liquid phase epitaxy (LPE) process, or a molecular beam epitaxy (MBE) process.

The third semiconductor layers SL3 formed by the epitaxial growth process may be formed of the same semiconductor material as that of the substrate 100. In an implementation, the substrate 100 may be a single-crystalline silicon substrate, and the third semiconductor layers SL3 may be single-crystalline silicon epitaxial layers. In an implementation, germanium (Ge) may be doped during the epitaxial growth process for forming the third semiconductor layers SL3.

After the formation of the third semiconductor layers SL3, the first mask pattern MP1 may be removed.

Figure 8A:
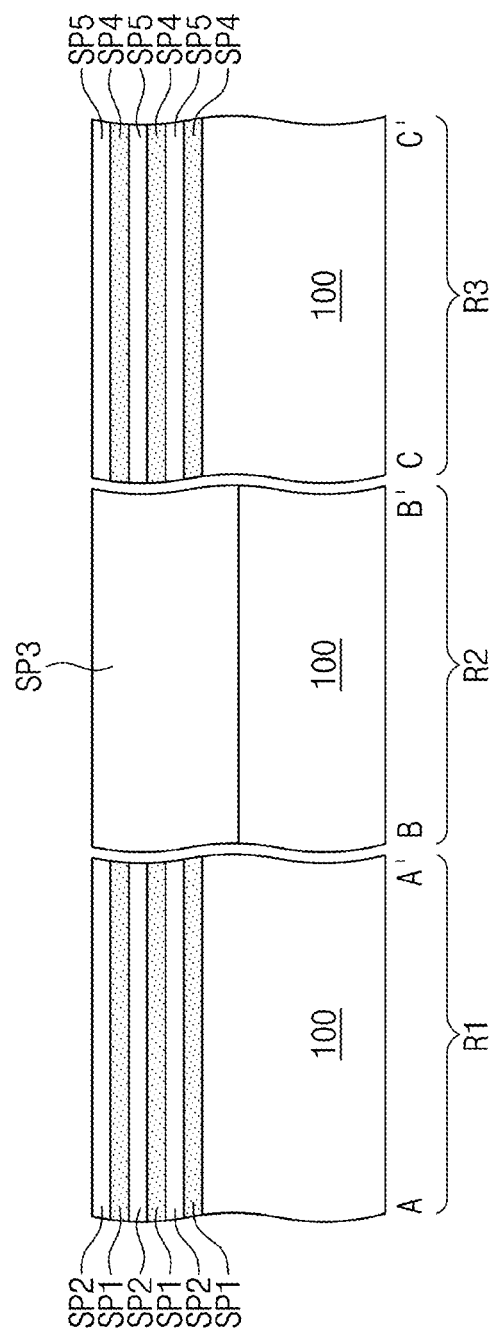
Figure 8B:
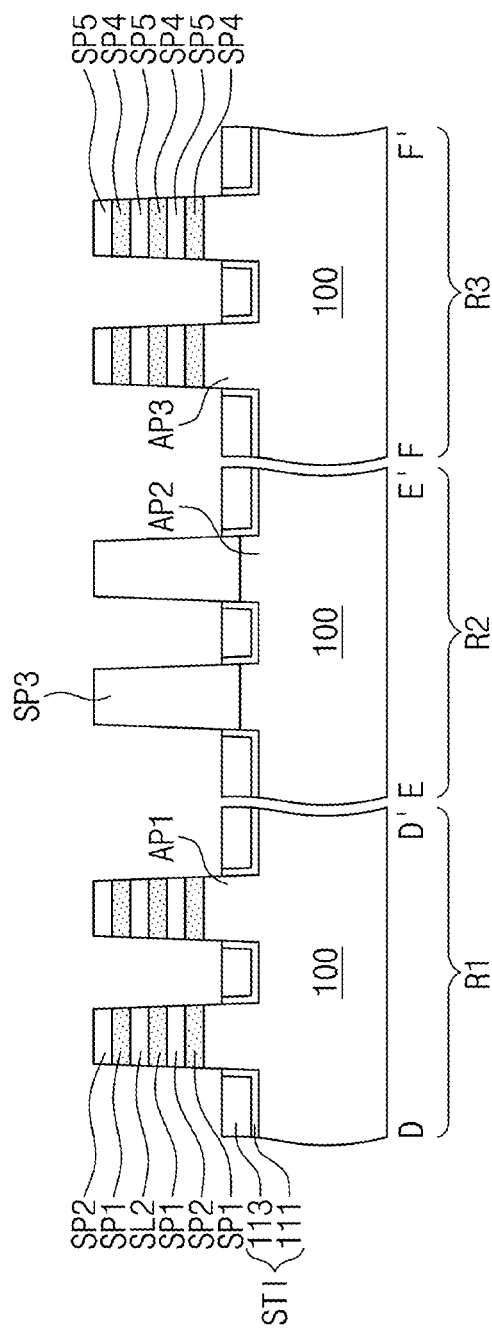

Referring to FIGS. 1, 8A, and 8B, first, second, and third active patterns AP1, AP2, and AP3 may be respectively formed on the first, second, and third regions R1, R2, and R3. The first, second, and third active patterns AP1, AP2, and AP3 may be formed on the first and second active regions PR and NR of the first, second, and third regions R1, R2, and R3, respectively. Each of the first, second, and third active patterns AP1, AP2, and AP3 may protrude from the substrate 100 and may extend parallel to a first direction D1.

In an implementation, the first, second, and third active patterns AP1, AP2, and AP3 may be formed at the same time. The formation of the first active pattern AP1 may include forming first and second semiconductor patterns SP1 and SP2 that are alternately stacked on the first active pattern AP1. The formation of the second active pattern AP2 may include forming a third semiconductor pattern SP3 on the second active pattern AP2. The formation of the third active pattern AP3 may include forming fourth and fifth semiconductor patterns SP4 and SP5 that are alternately stacked on the third active pattern AP3.

In an implementation, the first active pattern AP1 may be formed by forming a mask pattern that extends in the first direction D1 on the stack structure ST of the first region R1, and then partially etching the stack structure ST and the substrate 100. The second active pattern AP2 may be formed by forming a mask pattern that extends in the first direction D1 on the third semiconductor layers SL3 of the second region R2, and then partially etching the stack structure ST and the substrate 100. The third active pattern AP3 may be formed by forming a mask pattern (that extends in the first direction D1 on the stack structure ST of the third region R3, and then partially etching the stack structure ST and the substrate 100. The third active pattern AP3 may include fourth and fifth semiconductor patterns SP4 and SP5 thereon that are alternately stacked and are portions of the first and second semiconductor layers (see SL1 and SL2 of FIGS. 7A and 7B).

The formation of the first, second, and third active patterns AP1, AP2, and AP3 may include forming device isolation trenches on the first, second, and third regions R1, R2, and R3. After the formation of the first, second, and third active patterns AP1, AP2, and AP3, device isolation patterns STI may be formed between the first, second, and third active patterns AP1, AP2, and AP3.

The device isolation patterns STI may extend in the first direction D1, and neighboring first, second, and third active patterns AP1, AP2, and AP3 may be separated by the device isolation patterns STI from each other in a second direction D2. The device isolation patterns STI may have top surfaces at a lower level than that of top surfaces of the first, second, and third active patterns AP1, AP2, and AP3. Therefore, sidewalls of the first, second, and third semiconductor patterns SP1, SP2, and SP3 may be exposed by the device isolation patterns STI.

The formation of the device isolation patterns STI may include forming a liner dielectric layer that conformally covers inner walls of the device isolation trenches, forming a buried dielectric layer that fill the device isolation trenches in which the liner dielectric layer is formed, and etching the liner dielectric layer and the buried dielectric layer to expose sidewalls of the first, second, and third semiconductor patterns SP1, SP2, and SP3. Therefore, the device isolation pattern STI may include a buried dielectric pattern 113 and a liner dielectric pattern 111 between the buried dielectric pattern 113 and the substrate 100.

In an implementation, when the first and third active patterns AP1 and AP3 are formed, irregular sidewalls may be formed on the first and second semiconductor patterns SP1 and SP2 composed of different semiconductor materials.

Figure 9A:
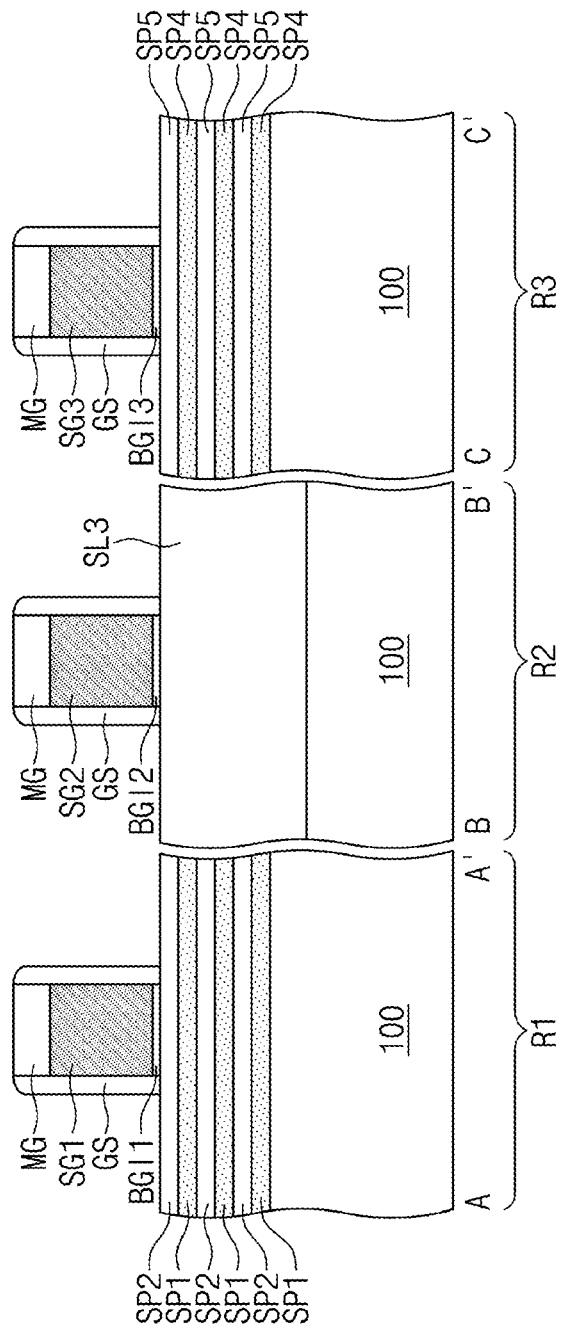
Figure 9B:
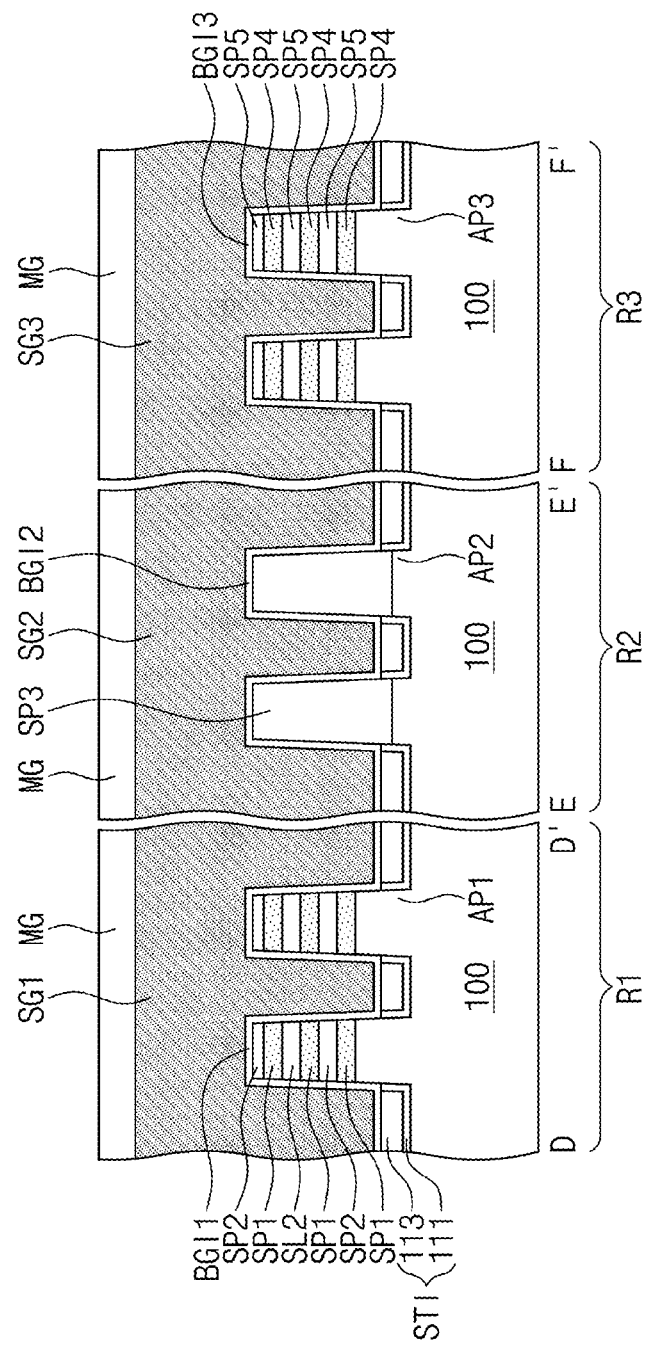

Referring to FIGS. 1, 9A, and 9B, a first sacrificial gate pattern SG1 may be formed to extend across the first active pattern AP1, a second sacrificial gate pattern SG2 may be formed to extend across the second active pattern AP2, and a third sacrificial gate pattern SG3 may be formed to extend across the third active pattern AP3.

The first, second, and third sacrificial gate patterns SG1, SG2, and SG3 may extend in the second direction D2. The first, second, and third sacrificial gate patterns SG1, SG2, and SG3 may extend across the first and second active regions PR and NR.

The formation of the first, second, and third sacrificial gate patterns SG1, SG2, and SG3 may include forming a sacrificial layer on an entire surface of the substrate 100, forming gate mask patterns MG on the sacrificial layer, and using the gate mask patterns MG as an etching mask to pattern the sacrificial layer.

The first, second, and third sacrificial gate patterns SG1, SG2, and SG3 may be formed of, e.g., an impurity-doped polysilicon layer, an impurity-undoped polysilicon layer, a silicon-germanium layer, or a silicon carbide layer. The gate mask patterns MG may be formed of a material, e.g., a silicon nitride layer, having an etch selectivity with respect to the sacrificial layer.

In an implementation, first, second, and third buffer gate dielectric layers BGI1, BGI2, and BGI3 may be formed before the first, second, and third sacrificial gate patterns SG1, SG2, and SG3 are formed. The first, second, and third buffer gate dielectric layers BGI1, BGI2, and BGI3 may include a silicon oxide layer, a silicon nitride layer, or a silicon oxynitride layer.

Successively, gate spacers GS may be formed on opposite sidewalls of each of the first, second, and third sacrificial gate patterns SG1, SG2, and SG3. The gate spacers GS may be formed by forming a gate spacer layer to conformally cover the first, second, and third sacrificial gate patterns SG1, SG2, and SG3, and then performing a blanket anisotropic etching process on the gate spacer layer. The gate spacers GS may be formed of, e.g., a silicon nitride layer.

Figure 10A:
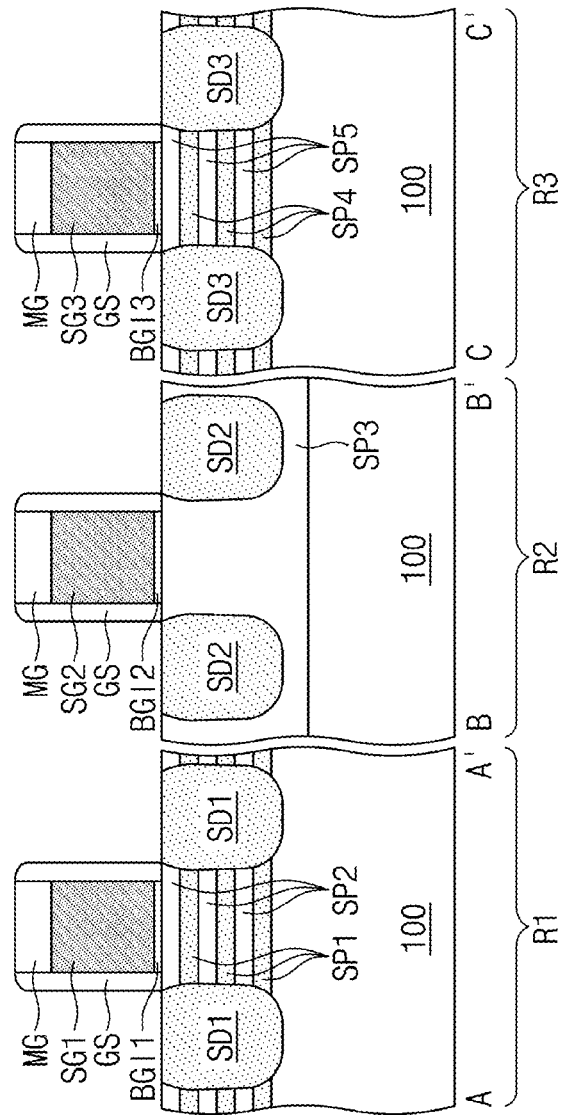
Figure 10B:
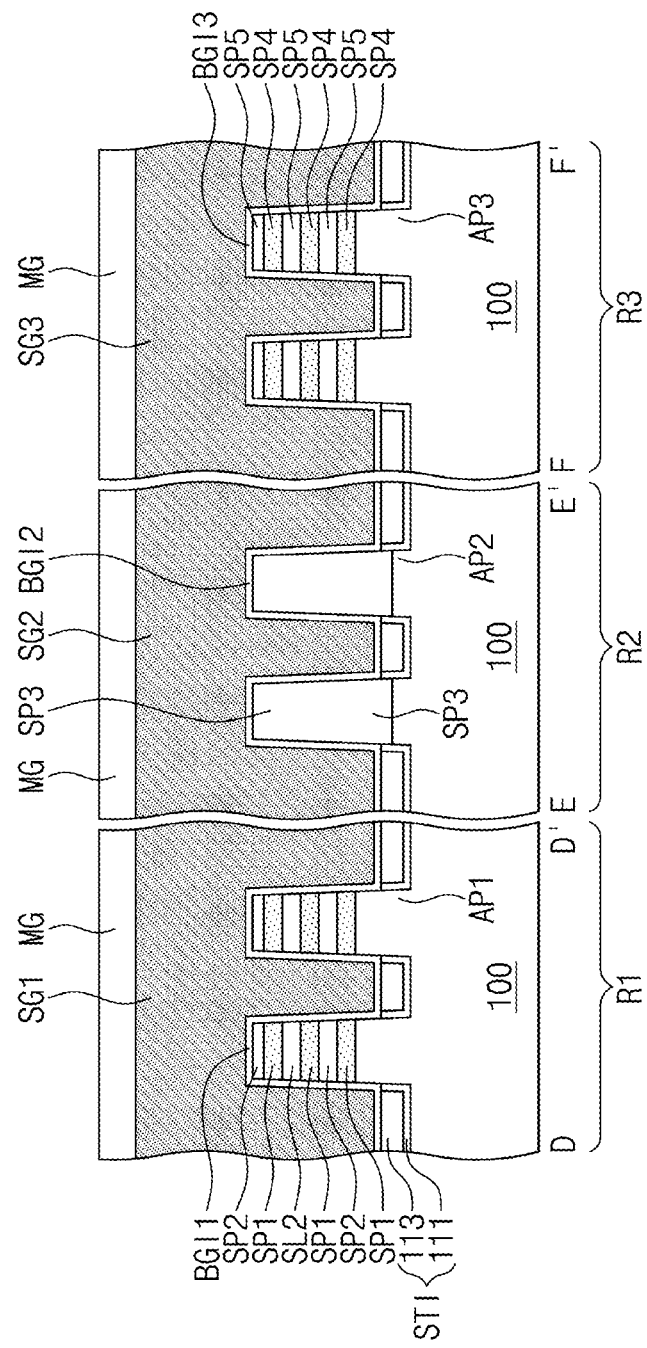

Referring to FIGS. 1, 10A, and 10B, first, second, and third source/drain patterns SD1, SD2, and SD3 may be respectively formed on the first, second, and third active patterns AP1, AP2, and AP3.

The first source/drain patterns SD1 may be formed on an upper portion of the first active pattern AP1. A pair of first source/drain patterns SD1 may be formed on opposite sides of the first sacrificial gate pattern SG1. The formation of the first source/drain patterns SD1 on the first active region PR may be performed separately from that of the first source/drain patterns SD1 on the second active region NR.

In an implementation, the gate mask patterns MG and the gate spacers GS may be used as an etching mask such that the first and second semiconductor patterns SP1 and SP2 on the first region R1 may be partially etched to form first recess regions.

The first source/drain pattern SD1 may be formed by performing a selective epitaxial growth process in which an inner wall of the first recess region of the first active pattern AP1 is used a seed layer. In an implementation, the selective epitaxial growth process may include a chemical vapor deposition (CVD) process or a molecular beam epitaxy (MBE) process.

As the first source/drain patterns SD1 are formed, a pair of first source/drain patterns SD1 may have a first channel structure CH1 therebetween, the first channel structure CH1 including first and second semiconductor patterns SP1 and SP2.

The first source/drain patterns SD1 may include a semiconductor element (e.g., SiGe or SiC) whose lattice constant is different from that of a semiconductor element of the substrate 100. Each of the first source/drain patterns SD1 may be formed of a plurality of semiconductor layers.

Impurities may be implanted in-situ during the selective epitaxial growth process for the formation of the first source/drain patterns SD1. In an implementation, after the first source/drain patterns SD1 are formed, impurities may be implanted into the first source/drain patterns SD1. The first source/drain patterns SD1 may be doped to have a first conductivity type (e.g., p-type) on the first active region PR and a second conductivity type (e.g., n-type) on the second active region NR.

The second source/drain patterns SD2 may be formed on an upper portion of the second active pattern AP2. A pair of second source/drain patterns SD2 may be formed on opposite sides of the second sacrificial gate pattern SG2. The formation of the second source/drain patterns SD2 on the first active region PR may be performed separately from that of the second source/drain patterns SD2 on the second active region NR.

The formation of the second source/drain patterns SD2 may include forming second recess regions by using the gate mask patterns MG and the gate spacers GS as an etching mask to partially etch the third semiconductor pattern SP3 on the second region R2, and performing a selective epitaxial growth process in which an inner wall of the second recess region is uses as a seed layer.

As the second source/drain patterns SD2 are formed, a pair of second source/drain patterns SD2 may have a second channel structure CH2 therebetween, the second channel structure CH2 including a third semiconductor pattern SP3.

The second source/drain patterns SD2 may include a semiconductor element (e.g., SiGe or SiC) whose lattice constant is different from that of a semiconductor element of the third semiconductor pattern SP3. Each of the second source/drain patterns SD2 may be formed of a plurality of semiconductor layers.

The formation of the third source/drain patterns SD3 on an upper portion of the third active pattern AP3 may be substantially the same as the formation of the first source/drain patterns SD1 discussed above. The first source/drain patterns SD1 may be formed at the same time with the third source/drain patterns SD3. As the third source/drain patterns SD3 are formed, a pair of third source/drain patterns SD3 may have a third channel structure CH3 therebetween, the third channel structure CH3 including fourth and fifth semiconductor patterns SP4 and SP5.

Figure 11A:
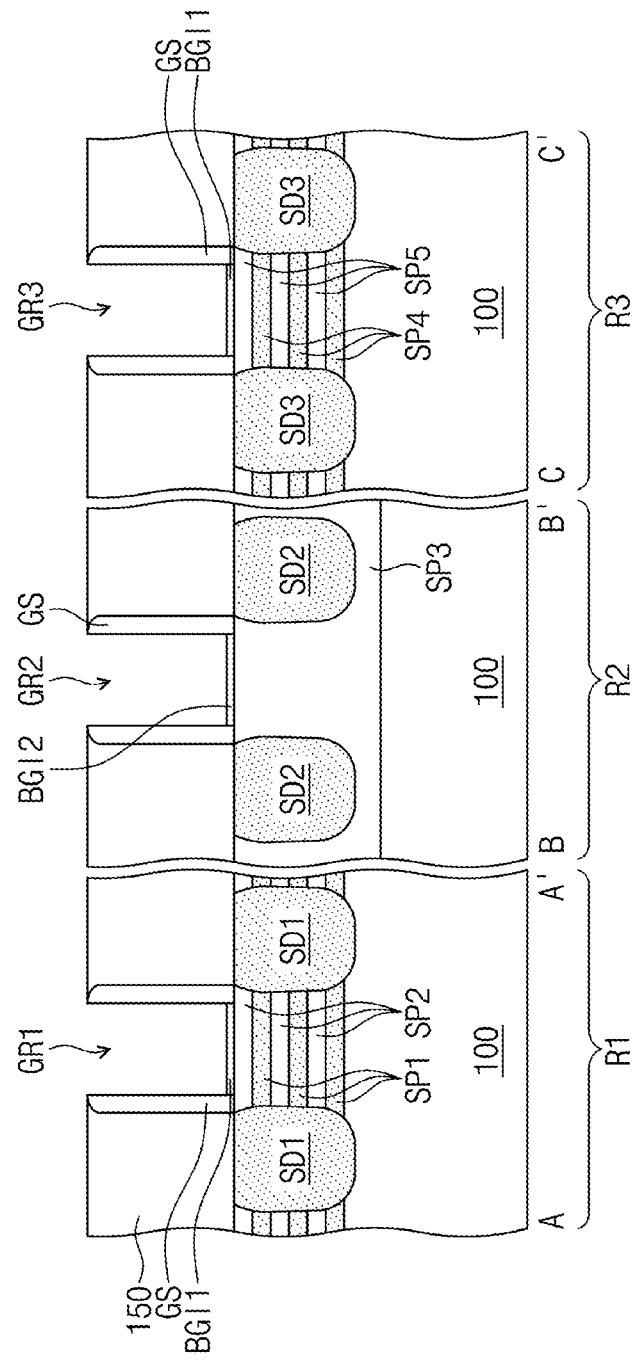
Figure 11B:
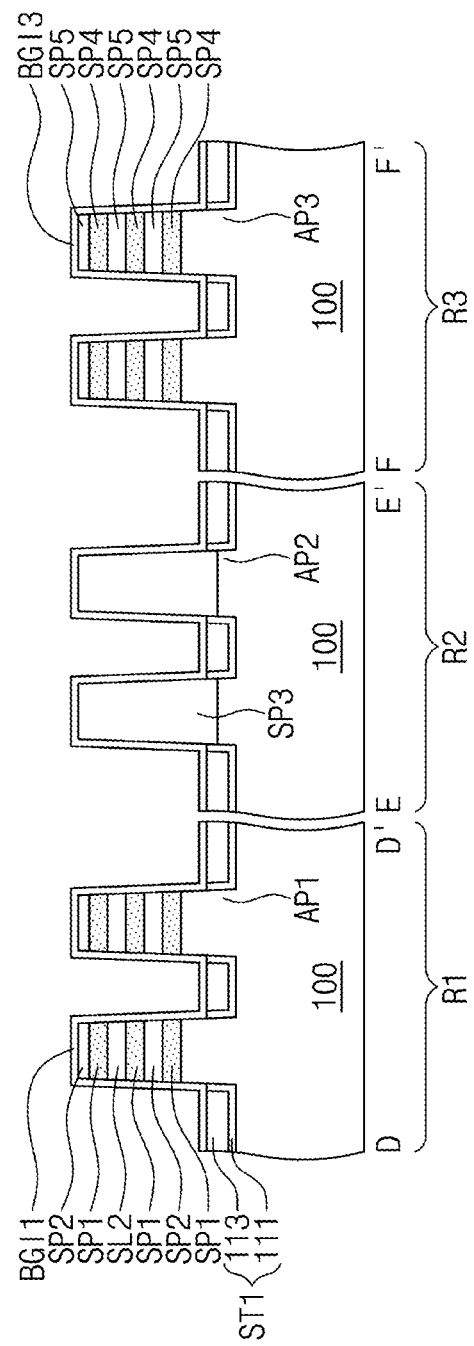

Referring to FIGS. 1, 11A, and 11B, after the first, second, and third source/drain patterns SD1, SD2, and SD3 are formed, a first interlayer dielectric layer 150 may be formed to fill between the first, second, and third sacrificial gate patterns SG1, SG2, and SG3. The first interlayer dielectric layer 150 may expose top surfaces of the first, second, and third sacrificial gate patterns SG1, SG2, and SG3.

In an implementation, the first interlayer dielectric layer 150 may be formed by forming a dielectric layer to fill between the first, second, and third sacrificial gate patterns SG1, SG2, and SG3, and then performing a planarization process to expose top surfaces of the gate mask patterns MG. The first interlayer dielectric layer 150 may include, e.g., a silicon oxide layer, which may be formed by a flowable chemical vapor deposition (FCVD) process. An etch-back or chemical mechanical polishing (CMP) process may be employed to planarize the first interlayer dielectric layer 150.

After the first interlayer dielectric layer 150 is formed, the first, second, and third sacrificial gate patterns SG1, SG2, and SG3 may be removed to form first, second, and third gate regions GR1, GR2, and GR3 between corresponding gate spacers GS.

The formation of the first, second, and third gate regions GR1, GR2, and GR3 may include etching the gate mask patterns MG and the first, second, and third sacrificial gate patterns SG1, SG2, and SG3 by using an etch recipe having an etch selectivity with respect to the gate spacers GS and the first interlayer dielectric layer 150.

The first, second, and third gate regions GR1, GR2, and GR3 may respectively expose the first, second, and third buffer gate dielectric layers BGI1, BGI2, and BGI3, and inner walls of the gate spacers GS may be exposed to the first, second, and third gate regions GR1, GR2, and GR3. The first, second, and third gate regions GR1, GR2, and GR3 may be formed to have vertical depths that are greater on the device isolation patterns STI than on the first, second, and third channel structures CH1, CH2, and CH3.

Figure 12A:
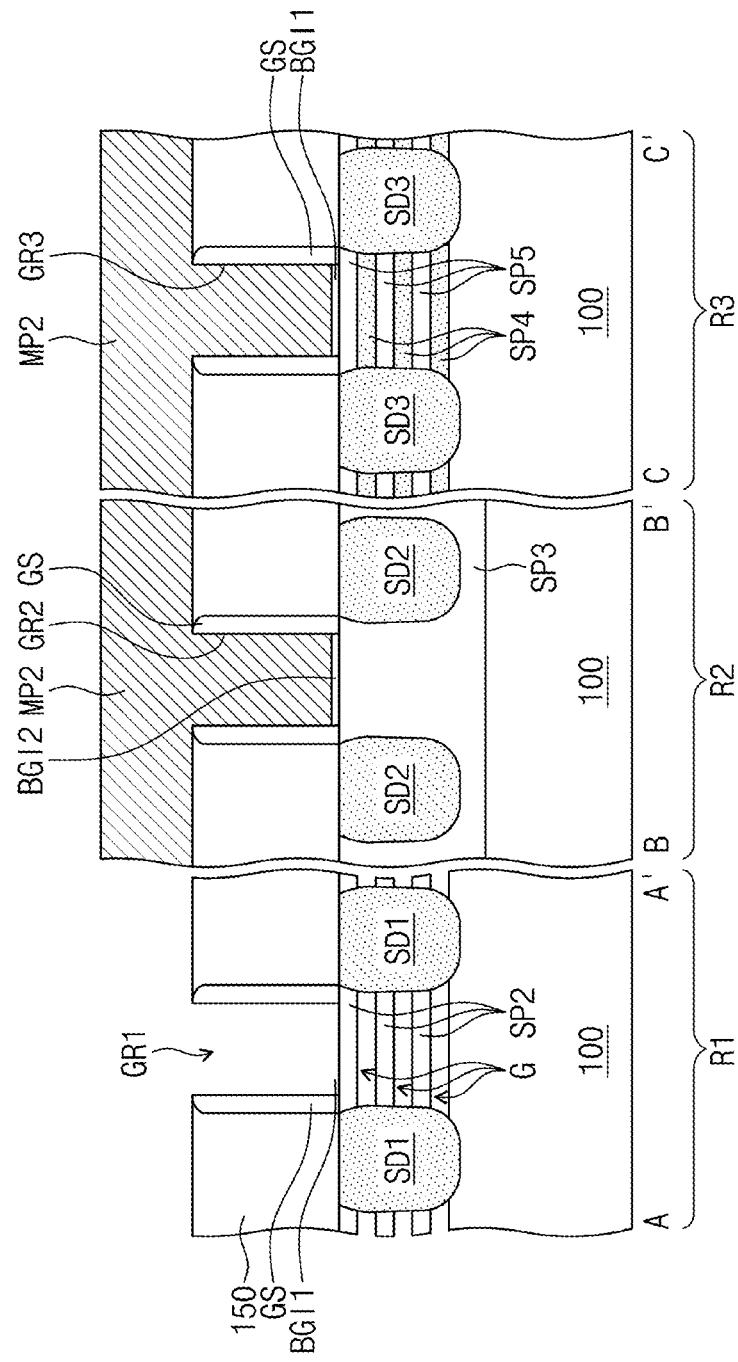
Figure 12B:
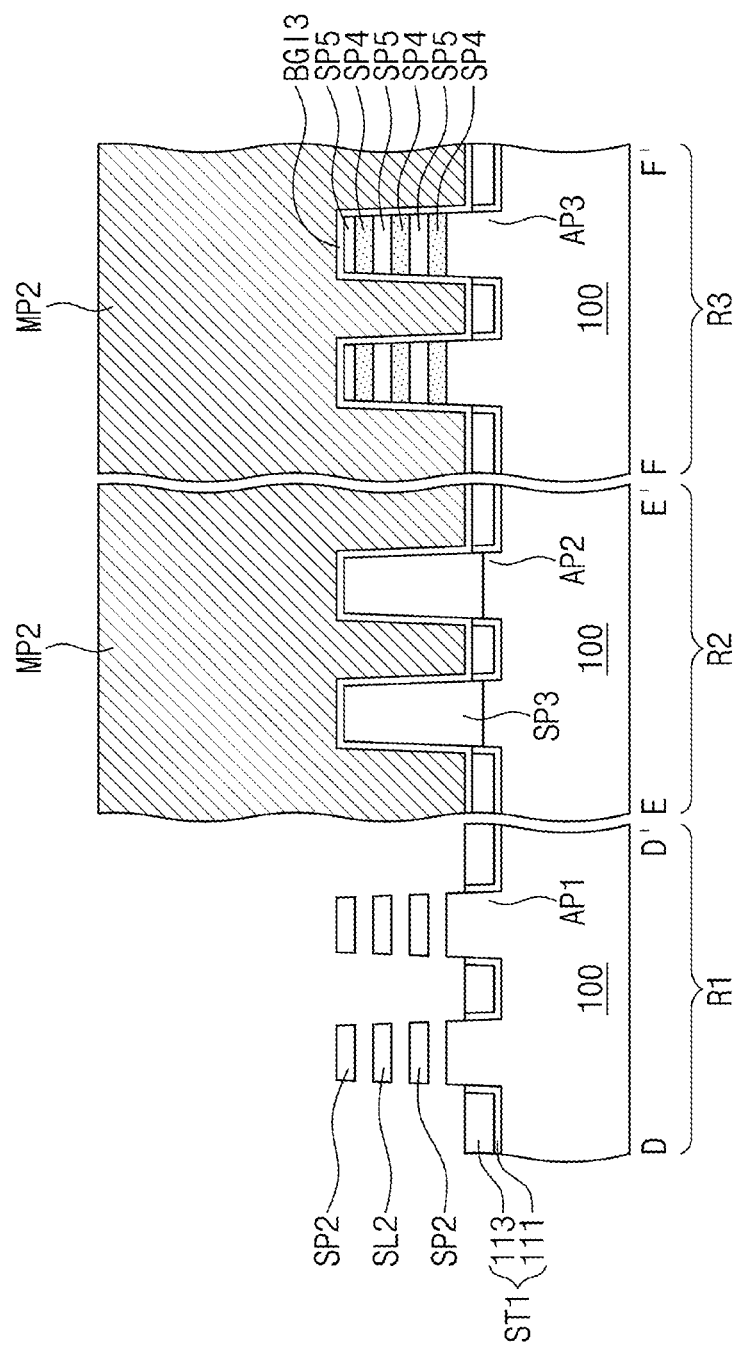

Referring to FIGS. 1, 12A, and 12B, a second mask pattern MP2 may be formed on the first interlayer dielectric layer 150 on which the first, second, and third gate regions GR1, GR2, and GR3, which second mask pattern MP2 may expose the first region R1 and cover the second and third regions R2 and R3.

The second mask pattern MP2 may fill the second and third gate regions GR2 and GR3. The second mask pattern MP2 may be formed of a material having an etch selectivity with respect to the first interlayer dielectric layer 150 and the gate spacers GS. After the second mask pattern MP2 is formed, the first buffer gate electric layer BGI1 exposed to the first gate region GR1 may be removed.

Thereafter, the first semiconductor patterns SP1 may be removed from the first region R1, and the second semiconductor patterns SP2 may have gap regions G therebetween that expose top and bottom surfaces of the second semiconductor patterns SP2. When the gap regions G are formed, an etching process may be performed which has an etch selectivity with respect to the second semiconductor patterns SP2.

Figure 13A:
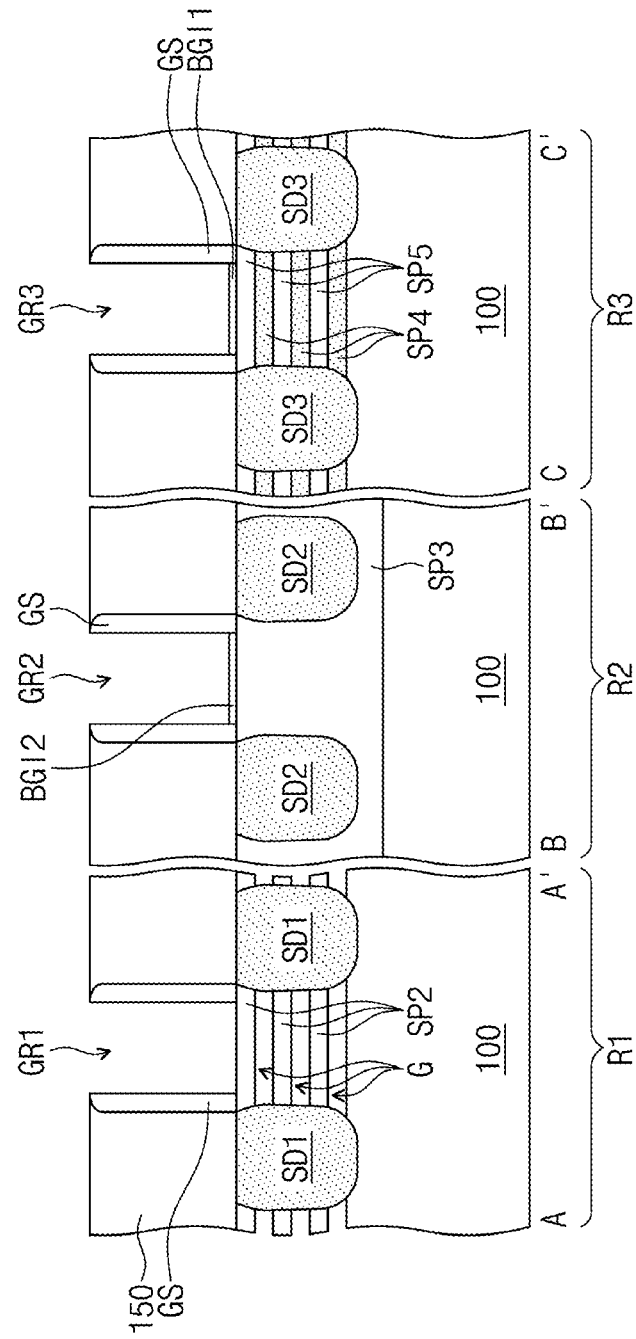
Figure 13B:
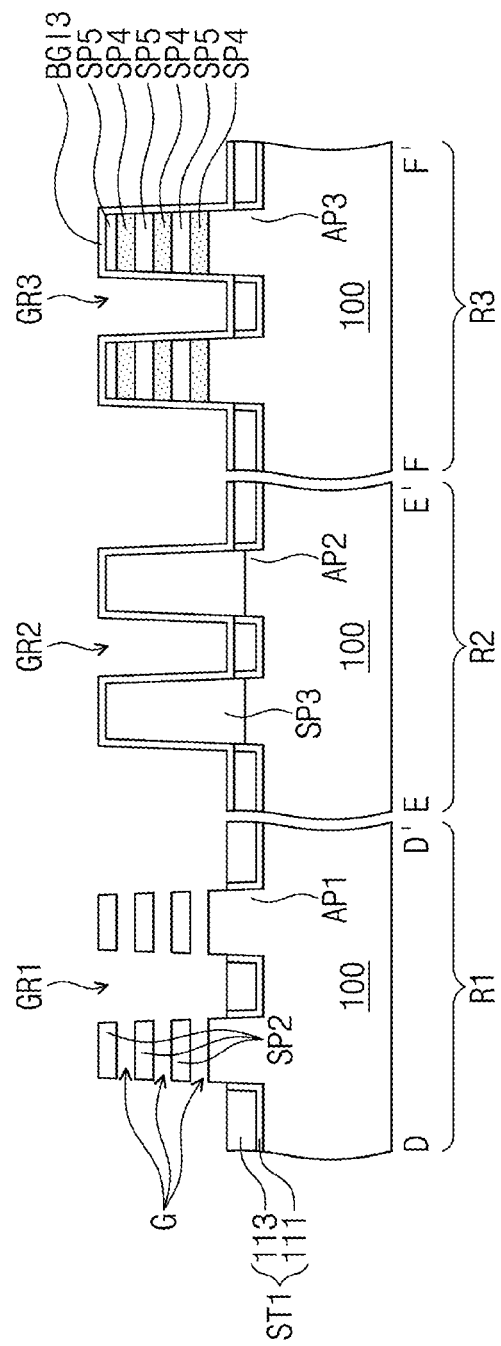

Referring to FIGS. 1, 13A, and 13B, after the formation of the gap regions G that expose the second semiconductor patterns SP2 on the first region R1, the second mask pattern MP2 and the second and third buffer gate dielectric layers BGI2 and BGI3 may be sequentially removed.

Therefore, second and third gate regions GR2 and GR3 may be respectively formed again in the second and third regions R2 and R3. In an implementation, the second region R2 may expose sidewalls of the third semiconductor pattern SP3, and the third region R3 may expose a side wall of the third channel structure CH3 (or sidewalls of the fourth and fifth semiconductor patterns SP4 and SP5) of the third channel structure CH3. The third channel structure CH3 may have an uneven sidewall or a bumpy sidewall. In an implementation, as shown in FIG. 3, the sidewalls of the fourth semiconductor patterns SP4 may be more laterally recessed than the sidewalls of the fifth semiconductor patterns SP5. In an implementation, the third gate region GR3 may expose the rounded sidewalls of the fourth semiconductor patterns SP4.

Figure 14A:
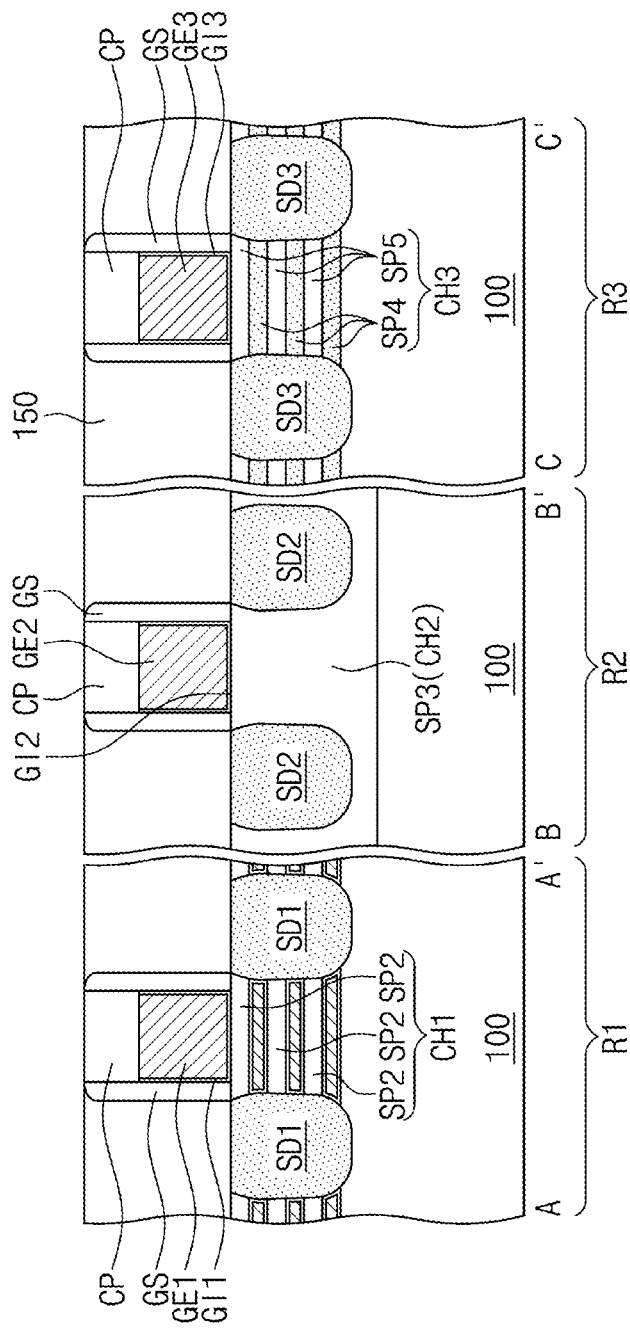
Figure 14B:
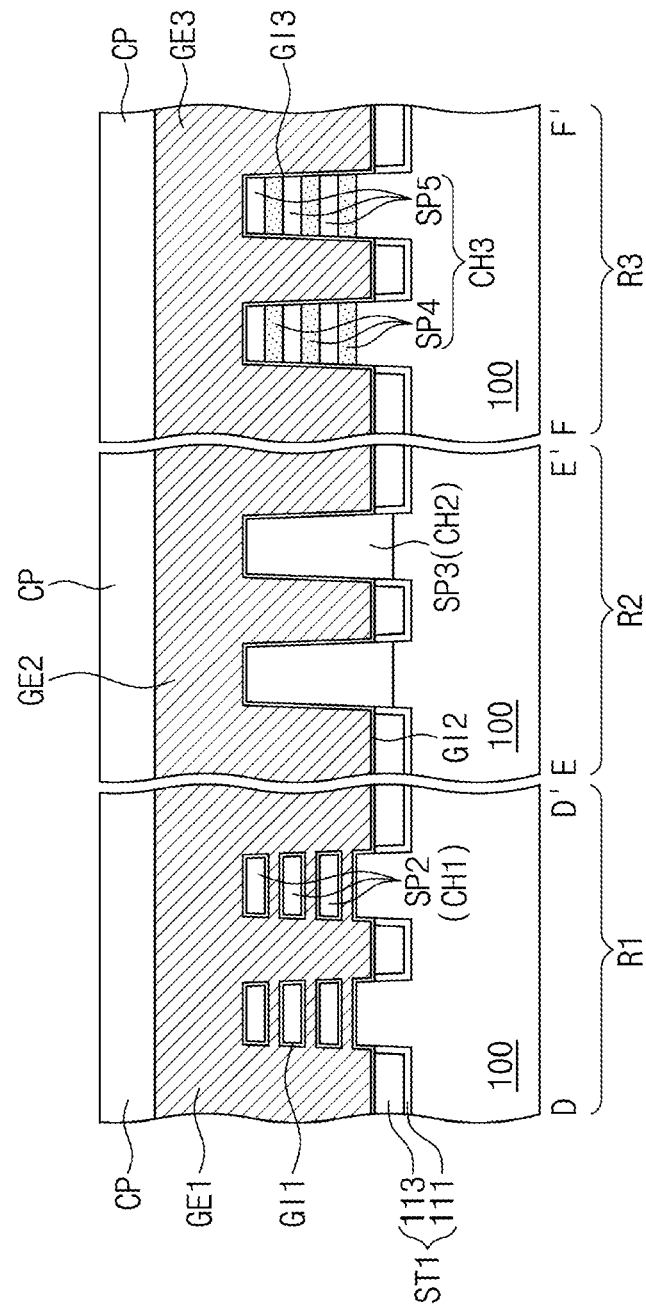

Referring to FIGS. 1, 14A, and 14B, first, second, and third gate dielectric layers GI1, GI2, and GI3 may be formed, and then first, second, and third gate electrodes GE1, GE2, and GE3 may be formed.

The first gate dielectric layer GI1 and the first gate electrode GE1 may be sequentially formed in the first gate region GR1 and the gap regions G. The second gate dielectric layer GI2 and the second gate electrode GE2 may be sequentially formed in the second gate region GR2, and the third gate dielectric layer GI3 and the third gate electrode GE3 may be sequentially formed in the third gate region GR3.

The first, second, and third gate dielectric layers GI1, GI2, and GI3 may be formed at the same time, and the first, second, and third gate electrodes GE1, GE2, and GE3 may be formed at the same time.

An atomic layer deposition technique may be used to form the first, second, and third gate dielectric layers GI1, GI2, and GI3 to conformally cover surfaces of the first, second, and third gate regions GR1, GR2, and GR3 and surfaces of the gap regions G. The first gate dielectric layer GI1 may conformally cover surfaces of the second semiconductor patterns SP2. The second gate dielectric layer GI2 may conformally cover opposite sidewalls and a top surface of the third semiconductor pattern SP3. The third gate dielectric layer GI3 may conformally cover opposite sidewalls of each of the fourth and fifth semiconductor patterns SP4 and SP5, and may also conformally cover a top surface of an uppermost fifth semiconductor pattern SP5.

The first, second, and third gate dielectric layers GI1, GI2, and GI3 may be formed of a high-k dielectric layer, e.g., a hafnium oxide layer, a hafnium silicate layer, a zirconium oxide layer, or a zirconium silicate layer.

The first, second, and third gate electrodes GE1, GE2, and GE3 may extend in the second direction D2, while extending across the first, second, and third channel structures CH1, CH2, and CH3, respectively. Each of the first, second, and third gate electrodes GE1, GE2, and GE3 may include a barrier metal pattern and a gate metal pattern. The barrier metal pattern may be formed of a conductive material, having a predetermined work function, e.g., a metal nitride layer such as a titanium nitride layer, a tantalum nitride layer, a tungsten nitride layer, a hafnium nitride layer, or a zirconium nitride layer. The gate metal pattern may be formed of a material whose resistivity is less than that of the barrier metal pattern. The gate metal pattern may be formed of, e.g., tungsten, copper, hafnium, zirconium, titanium, tantalum, aluminum, ruthenium, palladium, platinum, cobalt, nickel, a conductive metal nitride, or a combination thereof.

The first gate electrode GE1 may fill the gap regions Gin which the first gate dielectric layer GI1 is formed, and thus may surround each of the second semiconductor patterns SP2.

Capping dielectric patterns CP may be formed on the first, second, and third gate electrodes GE1, GE2, and GE3. The capping dielectric patterns CP may have top surfaces substantially coplanar with that of the first interlayer dielectric layer 150. The capping dielectric patterns CP may include, e.g., silicon oxide, silicon nitride, silicon oxynitride, silicon carbon nitride (SiCN), or silicon carbon oxynitride (SiCON).

Referring back to FIGS. 2A and 2B, a second interlayer dielectric layer 160 may be formed on the first interlayer dielectric layer 150. The second interlayer dielectric layer 160 may include a silicon oxide layer. First, second, and third active contacts AC1, AC2, and AC3 may be formed to penetrate the second and first interlayer dielectric layers 160 and 150 and to have electrical connection with the first, second, and third source/drain patterns SD1, SD2, and SD3, respectively. In addition, gate contacts GG may be formed to penetrate the second interlayer dielectric layer 160 and the capping dielectric patterns CP and to have electrical connection with the first, second, and third gate electrodes GE1, GE2, and GE3.

By way of summation and review, as semiconductor devices become highly integrated, the scale down of the MOSFETs may also be accelerated, and operating characteristics of the semiconductor device may deteriorate. Manufacturing a semiconductor device having superior performances while overcoming limitations due to high integration of the semiconductor device has been considered.

According to some example embodiments, field effect transistors having various channel shapes may be accomplished on first, second, and third regions. Therefore, it may be possible to form transistors whose properties are optimized for each region.

One or more embodiments may provide a semiconductor device including a field effect transistor.

One or more embodiments may provide a semiconductor device including highly integrated field effect transistors.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate that includes a first region, a second region, and a third region;
a first channel structure on the first region, the first channel structure including a plurality of first channel patterns that are vertically stacked on the substrate;
a second channel structure on the second region, the second channel structure including a second channel pattern on the substrate;
a third channel structure on the third region, the third channel structure including a plurality of third channel patterns and a plurality of fourth channel patterns that are vertically and alternately stacked on the substrate;
a first gate electrode on the first channel structure, a second gate electrode on the second channel structure, and a third gate electrode on the third channel structure; and
a first source/drain pattern on opposite sides of the first channel structure, a second source/drain pattern on opposite sides of the second channel structure, and a third source/drain pattern on opposite sides of the third channel structure,
wherein:
the plurality of first channel patterns, the second channel pattern, and the plurality of fourth channel patterns each include a first semiconductor material, and
the plurality of third channel patterns include a second semiconductor material different from the first semiconductor material.

2. The semiconductor device as claimed in claim 1, wherein the plurality of first channel patterns are at a level substantially the same as a level of the plurality of fourth channel patterns.

3. The semiconductor device as claimed in claim 1, wherein the first gate electrode extends across the first channel structure and surrounds each first channel pattern of the plurality of first channel patterns.

4. The semiconductor device as claimed in claim 1, further comprising a first dielectric layer between the first gate electrode and the first channel structure, a second dielectric layer between the second gate electrode and the second channel structure, and a third gate dielectric layer between the third gate electrode and the third channel structure,
wherein the first gate dielectric layer conformally covers a surface of each first channel pattern of the plurality of first channel patterns.

5. The semiconductor device as claimed in claim 4, wherein:
the third gate dielectric layer conformally covers a surface of the third channel structure, and
the third gate dielectric layer is in contact with sidewalls of the plurality of third channel patterns and sidewalls of the plurality of fourth channel patterns.

6. The semiconductor device as claimed in claim 1, wherein
the second gate electrode extends across the second channel structure and covers opposite sidewalls of the second channel pattern, and
the third gate electrode extends across the third channel structure and covers opposite sidewalls of the plurality of third channel patterns and opposite sidewalls of the plurality of fourth channel patterns.

7. The semiconductor device as claimed in claim 1, wherein the first semiconductor material and the second semiconductor material each independently include silicon, germanium, silicon-germanium, or a group compound semiconductor.

8. The semiconductor device as claimed in claim 1, wherein:
the first semiconductor material includes silicon, and
the second semiconductor material includes silicon-germanium.

9. A semiconductor device, comprising:
a substrate that includes a first region, a second region, and a third region;
a first channel structure on the first region, the first channel structure including a plurality of first channel patterns that are vertically stacked on the substrate;
a second channel structure on the second region, the second channel structure including a second channel pattern on the substrate;
a third channel structure on the third region, the third channel structure including a plurality of third channel patterns and a plurality of fourth channel patterns that are vertically and alternately stacked on the substrate;
a first gate electrode on the first channel structure, a second gate electrode on the second channel structure, and a third gate electrode on the third channel structure;

a first dielectric layer between the first gate electrode and the first channel structure, a second dielectric layer between the second gate electrode and the second channel structure, and a third gate dielectric layer between the third gate electrode and the third channel structure; and a first source/drain pattern on opposite sides of the first channel structure, a second source/drain pattern on opposite sides of the second channel structure, and a third source/drain pattern on opposite sides of the third channel structure, wherein:

the third channel structure has an uneven sidewall, and the third gate dielectric layer covers the uneven sidewall.

10. The semiconductor device as claimed in claim 9, wherein sidewalls of the plurality of third channel patterns are laterally recessed to a greater depth than a depth to which sidewalls of the plurality of fourth channel patterns are laterally recessed.

11. The semiconductor device as claimed in claim 9, wherein each third channel pattern of the plurality of third channel patterns has a rounded sidewall.

12. The semiconductor device as claimed in claim 9, wherein the third gate dielectric layer conformally covers a surface of the third channel structure and contacts sidewalls of the plurality of third channel patterns and sidewalls of the plurality of fourth channel patterns.

13. The semiconductor device as claimed in claim 9, wherein the first gate electrode extends across the first channel structure and surrounds each first channel pattern of the plurality of first channel patterns.

14. The semiconductor device as claimed in claim 9, wherein the first gate dielectric layer conformally covers a surface of each first channel pattern of the plurality of first channel patterns.

15. A semiconductor device, comprising:

a substrate that includes a first region, a second region, and a third region;

a first channel structure on the first region, the first channel structure including a plurality of first channel patterns that are vertically stacked on the substrate;

a second channel structure on the second region, the second channel structure including a second channel pattern on the substrate;

a third channel structure on the third region, the third channel structure having an uneven sidewall and including a plurality of third channel patterns and a plurality of fourth channel patterns that are vertically and alternately stacked on the substrate;

a first gate electrode on the first channel structure, a second gate electrode on the second channel structure, and a third gate electrode on the third channel structure;

a first dielectric layer between the first gate electrode and the first channel structure, a second dielectric layer between the second gate electrode and the second channel structure, and a third gate dielectric layer between the third gate electrode and the third channel structure; and a first source/drain pattern on opposite sides of the first channel structure, a second source/drain pattern on opposite sides of the second channel structure, and a third source/drain pattern on opposite sides of the third channel structure, wherein:

the plurality of first channel patterns, the second channel pattern, and the plurality of fourth channel patterns each include silicon, and the plurality of third channel patterns each include silicon-germanium.

16. The semiconductor device as claimed in claim 15, wherein sidewalls of the plurality of third channel patterns are laterally recessed to a greater depth than a depth to which sidewalls of the plurality of fourth channel patterns are laterally recessed.

17. The semiconductor device as claimed in claim 15, wherein each third channel pattern of the plurality of third channel patterns has a rounded sidewall.

18. The semiconductor device as claimed in claim 15, wherein the first gate electrode extends across the first channel structure and surrounds each first channel pattern of the plurality of first channel patterns.

19. The semiconductor device as claimed in claim 18, wherein the first gate dielectric layer conformally covers a surface of each first channel pattern of the plurality of first channel patterns.

20. The semiconductor device as claimed in claim 15, wherein:

the second gate electrode extends across the second channel structure and covers opposite sidewalls of the second channel pattern, and the third gate electrode extends across the third channel structure and covers opposite sidewalls of the plurality of third channel patterns and sidewalls of the plurality of fourth channel patterns.

* * * * *